(12) United States Patent
Kurokawa

(10) Patent No.: US 7,675,796 B2
(45) Date of Patent: Mar. 9, 2010

(54) SEMICONDUCTOR DEVICE

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 512 days.

(21) Appl. No.: 11/634,903

(22) Filed: Dec. 7, 2006

(65) Prior Publication Data
US 2007/0147151 A1 Jun. 28, 2007

(30) Foreign Application Priority Data
Dec. 27, 2005 (JP) ............... 2005-375564

(51) Int. Cl.
*G11C 7/00* (2006.01)

(52) U.S. Cl. .............. 365/192; 365/145; 365/102

(58) Field of Classification Search ............ 365/192, 365/145, 102; 710/10, 13; 711/115, 156
See application file for complete search history.

(56) References Cited

U.S. PATENT DOCUMENTS

| | | | |
|---|---|---|---|
| 3,191,151 A * | 6/1965 | Price ................ 365/96 |
| 4,581,628 A * | 4/1986 | Miyauchi et al. ........ 257/529 |
| 6,274,440 B1 * | 8/2001 | Arndt et al. ............ 438/281 |
| 2002/0167026 A1 | 11/2002 | Azami et al. |
| 2003/0183699 A1* | 10/2003 | Masui ................ 235/492 |
| 2004/0257136 A1 | 12/2004 | Osame et al. |
| 2005/0133605 A1* | 6/2005 | Koyama et al. ........ 235/492 |
| 2005/0140495 A1 | 6/2005 | Yamazaki et al. |
| 2005/0210302 A1* | 9/2005 | Kato et al. ........... 713/320 |
| 2006/0094380 A1* | 5/2006 | Slatter ............... 455/151.2 |

FOREIGN PATENT DOCUMENTS

| JP | 2005-209162 | 8/2005 |
|---|---|---|
| WO | WO 2005/088532 | 9/2005 |

OTHER PUBLICATIONS

A Low-Voltage Alterable EEPROM with Metal Oxide-Nitride-Oxide-Semiconductor (MONOS) Structures, E. Suzuki et al., IEEE Transactions on Electron Devices, vol. ED-30, No. 2, Feb. 1983, pp. 122-128.*

* cited by examiner

*Primary Examiner*—Richard Elms
*Assistant Examiner*—Harry W Byrne
(74) *Attorney, Agent, or Firm*—Eric J. Robinson; Robinson Intellectual Property Law Office, P.C.

(57) ABSTRACT

Information stored in a nonvolatile storage device mounted to a semiconductor device is read by inputting an address signal or the like and by using a sense amplifier or the like. At this time, since a prescribed period of time is required, it is necessary to design a semiconductor device taking that delay into consideration. Also, a sense amplifier consumes an enormous amount of current. Further, since the number of reading bits is set, it is also necessary to read other unnecessary information when only 1 bit is to be read. A nonvolatile storage circuit is formed by a memory element that is formed by an electrical element having an electrically conducting or insulating means, a reset element, and a latch element. In the storage element, different information is stored in the latch element depending on whether the electrical element is electrically insulated or conductive, when the wireless chip is reset. With such a structure, a low power consumption wireless chip mounted with a nonvolatile storage device can be provided a low cost.

16 Claims, 19 Drawing Sheets

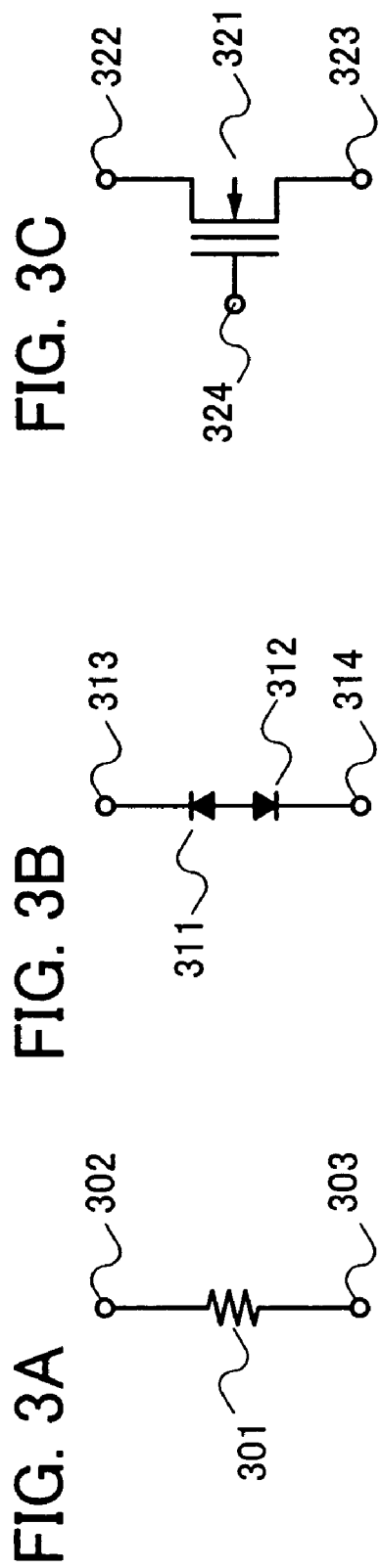

1601
1602

1601 1603

1601
1604

1601
1605

SEMICONDUCTOR DEVICE

BACKGROUND OF THE INVENTION

1. Field of the Invention

The present invention relates to a semiconductor device for wireless communication. In particular, the present invention relates to a semiconductor device in which a circuit formed using a semiconductor thin film transistor is supplied with a power supply voltage generated from a wireless communication signal.

2. Description of the Related Art

In recent years, a compact semiconductor device (hereinafter referred to as a wireless chip) that is a combination of an ultra compact IC chip and an antenna for wireless communication has received a lot of attention. Data can be written in and read from the wireless chip by transferring a communication signal using a wireless communication device (hereinafter referred to as a reader/writer).

As an application field of the wireless chip, merchandise management in the distribution industry is given as an example. At present, merchandise management utilizing barcodes is the main stream; however, since barcodes are read optically, data cannot be read when there is an interrupting object. On the other hand, since the wireless chip reads data wirelessly, the data can be read even if there is an interruption object as long as electrical waves can pass through it. Consequently, an improvement in efficiency, reduction in cost and the like of merchandise management are expected. In addition, the wireless chip is expected to be widely applied, such as to train tickets, airplane tickets, and automatic resets (for example, refer to Patent Document 1: Japanese Published Patent Application No. 2005-209162).

SUMMARY OF THE INVENTION

In such application fields of the wireless chip, a nonvolatile storage device for storing specific information of the wireless chip is necessary. Specific information is for example a specific number or a secret key for cipher communication. Such a nonvolatile storage device can be classified broadly into two categories by methods of storing specific information, which are a nonvolatile storage device using a method of writing during manufacturing, and a nonvolatile memory device using a method of writing after manufacturing.

As the nonvolatile storage device using a method of writing during manufacturing, there is a nonvolatile storage device called a mask ROM. In this nonvolatile storage device, a different photomask is used for every wireless chip. On the other hand, as the nonvolatile memory device using a method of writing after manufacturing, there is a nonvolatile storage device called an EPROM that is electrically writable. In other words, specific information is written in the EPROM using a writing device. In this case, different specific information is easily stored in the nonvolatile storage device for every wireless chip without changing a photomask.

In order to take out stored data from these nonvolatile storage devices, an address signal, a reading signal or the like is input to take out an electrical signal from a relevant storage element, and output information of a high potential signal or a low potential signal (hereinafter, the high potential signal is referred to as an "H" level, or simply "H," and the low potential signal is referred to as an "L" level, or simply "L") using a sense amplifier or the like. With such a nonvolatile storage device, a certain amount of time is required for reading necessary information, from the time reading is requested. Consequently, in order for a semiconductor device to be mounted with such a nonvolatile storage device, a design that takes this delay into consideration is necessary. Also, the sense amplifier consumes an enormous amount of current, which causes a rise in current consumption of the semiconductor device as a whole. Further, since the number of reading bits is set in such a nonvolatile storage device, even when only 1 bit is read, it is also necessary to read other unnecessary information. This further increases the current consumption in the semiconductor device.

In view of the foregoing problems, an object of the present invention is to reduce power consumption of a semiconductor device mounted with a nonvolatile storage device for storing specific information. Another object of the present invention is to reduce an affect of delay time from reading information from the nonvolatile storage device in the semiconductor device.

In a wireless chip according to the present invention, a nonvolatile storage circuit includes a storage element, which includes an electrical element including an electrically conducting or insulating means, a reset element, and a latch element. In the storage element, information is stored in the latch element by the reset element and the electrical element of the wireless chip when the wireless chip is reset. This information becomes "H" or "L" depending on whether the electrical element is electrically insulated or not. As the electrical element, an electrical resistor for which electrical insulation is possible by mechanical cutting by laser drawing, an electrical resistor and a diode for which electrical insulation is possible by thermal destruction by application of excess current, a phase change memory, a memory transistor including a floating gate, a memory transistor having a MONOS structure, or the like is possible.

By having a structure such as the foregoing, a wireless chip with low power consumption mounted with a nonvolatile storage device can be provided at low cost. Also, an increase in a circuit scale of the nonvolatile storage device can be suppressed because stored information can be read from the nonvolatile storage device without requiring a special circuit for reading such as a sense amplifier; therefore, a wireless chip mounted with a nonvolatile storage device with even smaller area and lower power consumption can be provided.

A structure of the present invention disclosed in this specification is a semiconductor device mounted with a nonvolatile storage device including a storage element that includes an electrical element, a reset element and a latch element. The semiconductor device has a means for storing different information in the latch element by the reset element in response to whether the electrical element is electrically conductive or insulated.

In the foregoing structure, the electrical element may be electrically insulated by mechanical cutting by laser drawing.

In the foregoing structure, the electrical element may be electrically insulated by thermal destruction by applying excess current.

In the foregoing structure, the electrical element includes a first diode and a second diode, and may be electrically conductive by thermal destruction by applying excess current to at least one of the diodes.

In the foregoing structure, the electrical element may include a phase change memory in which an electrical resistance value changes by phase change.

In the foregoing structure, the electrical element may be a nonvolatile memory transistor including a floating gate.

In the foregoing structure, the electrical element may be a memory transistor having a MONOS structure.

In the foregoing structure, the semiconductor device may be formed using a thin film transistor, which has a semiconductor thin film formed over a substrate having an insulating surface as an activation layer.

In the foregoing structure, the substrate having an insulating surface may be any of a glass substrate, a quartz substrate, a plastic substrate, and an SOI substrate.

According to the present invention, a high performance and low power consumption wireless chip mounted with a nonvolatile storage device can be provided at low cost.

BRIEF DESCRIPTION OF DRAWINGS

In the following drawings:

FIGS. 3A to 3C each shows an example of a storage element of a semiconductor device according to the present invention;

DETAILED DESCRIPTION OF THE INVENTION

Embodiment Mode

Figure 1:
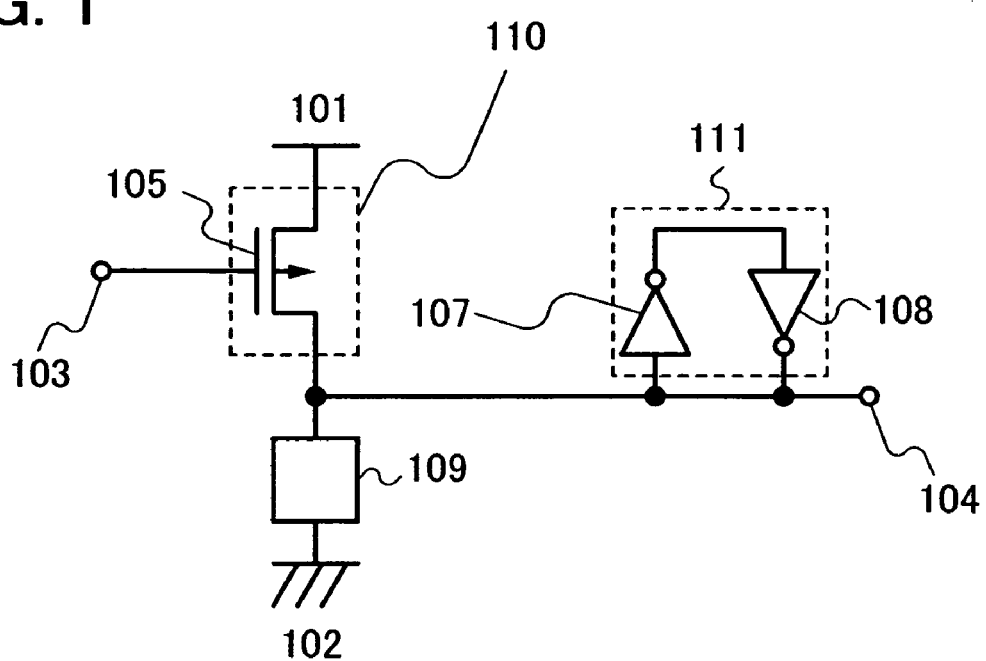
FIG. 1 is a circuit diagram of a storage element of a semiconductor device according to the present invention.

Embodiment modes of the present invention will hereinafter be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in all drawings for describing the embodiment modes, the same reference numerals are used for the same portions or the portions having similar functions, and the repeated description thereof is omitted.

(Embodiment Mode 1)

A first embodiment mode of a wireless chip according to the present invention is described with reference to FIG. 1. FIG. 1 shows a circuit diagram of a storage element of a nonvolatile storage device that is mounted to the wireless chip according to the present invention.

In FIG. 1, reference numerals 101, 102, 103, 104, 105, 107, 108, and 109 denote a power supply terminal, a ground terminal, a reset terminal, an output terminal, a P-type transistor, a first inverter, a second inverter, and an electronic element, respectively. The P-type transistor 105 forms the reset element 110. A source terminal, a drain terminal and a gate terminal of the P-type transistor 105 are connected to the power supply terminal 101, the output terminal 104, and the reset terminal 103, respectively. Also, the first inverter 107 and the second inverter 108 form a latch element 111.

As the electrical element, an electrical resistor for which electrical insulation is possible by mechanical cutting by laser drawing, an electrical resistor or a diode for which electrical insulation is possible by thermal destruction by application of excess current, a phase change memory, a memory transistor including a floating gate, a memory transistor a MONOS having structure, or the like is possible.

Next, an operation of the storage element is described. First a case where the electrical element 109 is electrically conductive is considered. Note that here, electrical resistance of the electrical element 109 is to be higher than source-drain resistance of the P-type transistor 105. First, "L" is applied to the reset terminal 103 when the wireless chip is reset. Since the P-type transistor 105 becomes electrically conductive, "H" is output to the output terminal 104. Also, at the same time, "H" is retained in the latch element 111. Subsequently, when "H" is applied to the reset terminal 103, the P-type transistor 105 becomes electrically insulated, and by electrical resistance of the electrical element 109, "L" is output to the output terminal 104. Further, at the same time, information retained in the latch element 111 changes from "H" to "L." During operation of the wireless chip, if "H" is maintained in the reset terminal 103, the output terminal 104 will constantly output "L."

Now, a case where the electrical element 109 is electrically insulated is considered. Here, when the wireless chip is reset, "L" is applied to the reset terminal 103. Since the P-type transistor 105 becomes electrically conductive, "H" is output to the output terminal 104. Also, at the same time, "H" is retained in the latch element 111. Subsequently, when "H" is applied to the reset terminal 103, the P-type transistor 105 becomes electrically insulated. Here, since the electrical element 109 is electrically insulated, information retained in the latch element 111 remains as "H." Consequently, "H" keeps being output to the output terminal 104. During operation of the wireless chip, if "H" is maintained in the reset terminal 103, the output terminal 104 will constantly output "H."

In the above manner, output of the storage element can be made to be "H" or "L" depending on whether the electrical element in the storage element is electrically insulated or conductive. Also, just by applying "L" to the reset terminal 103 in the beginning when a circuit operation is started, accessing time when reading thereafter is not required. Further, a special circuit such as a sense amplifier is not required.

Note that this embodiment mode shows a structure of connecting the electrical element 109 to be between the ground terminal 102 and the output terminal 104, and connecting the source terminal, the drain terminal, and the gate terminal of the P-type transistor 105 to the power supply terminal 101, the output terminal 104, and the reset terminal 103, respectively. However, the structure may be that of connecting the electrical element to be between the power supply terminal 101 and the output terminal 104, and connecting a source terminal, a drain terminal, and a gate terminal of an N-type transistor to the ground terminal 102, the output terminal 104, and the reset terminal 103, respectively. In this case, by applying "H" to the reset terminal 103 when resetting, output of the storage element can be made to be "L" or "H" depending on whether the electrical element is electrically insulated or conductive.

By having a structure such as the foregoing, a wireless chip with low power consumption mounted with a nonvolatile storage device can be provided at low cost. Also, an increase in a circuit scale of the nonvolatile storage device can be suppressed because stored information can be read from the nonvolatile storage device without requiring a special circuit for reading such as a sense amplifier; therefore, a wireless chip mounted with a nonvolatile storage device with even smaller area and lower power consumption can be provided.

(Embodiment Mode 2)

Figure 2:
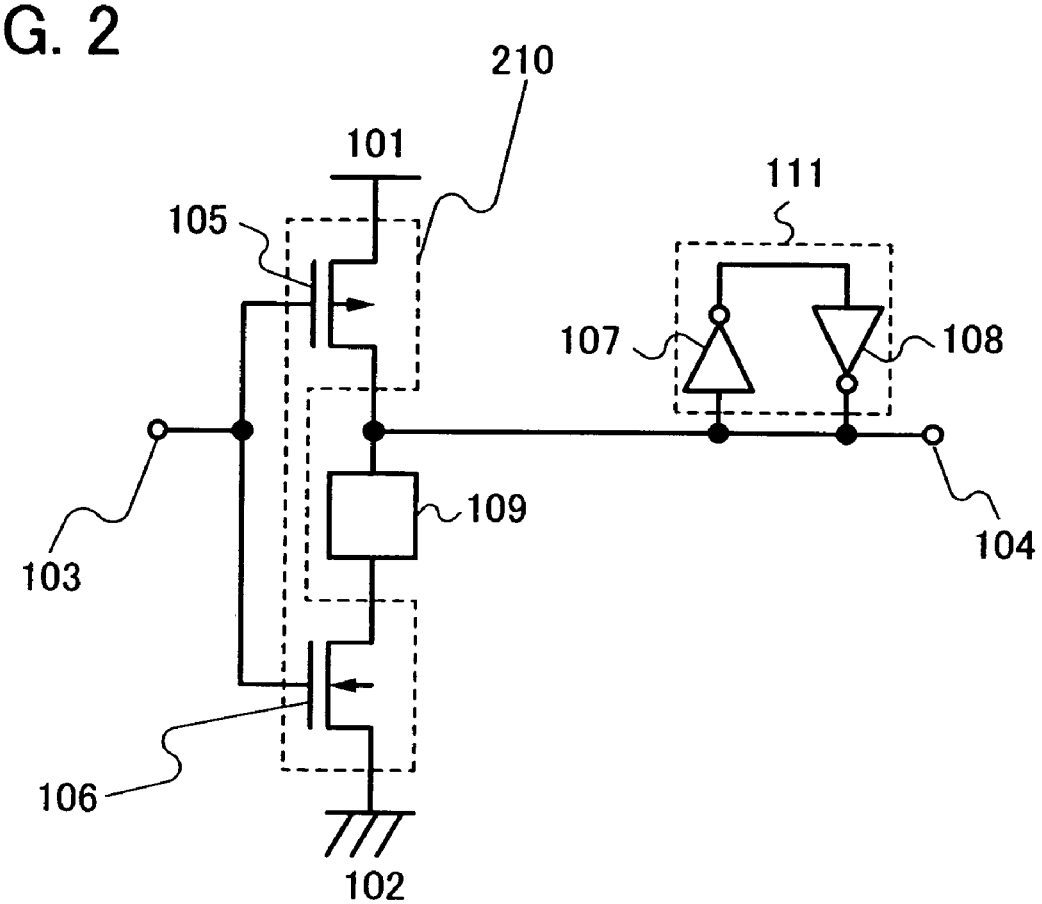
FIG. 2 is a circuit diagram of a storage element of a semiconductor device according to the present invention.

As a second embodiment mode of a wireless chip according to the present invention, a wireless chip with a structure different from that of the first embodiment mode is described with reference to FIG. 2. FIG. 2 is a circuit diagram of a storage element of a nonvolatile storage device that is mounted to the wireless chip according to the present invention.

FIG. 2 includes the power supply terminal 101, the ground terminal 102, the reset terminal 103, the output terminal 104, the P-type transistor 105, an N-type transistor 106, the first inverter 107, the second inverter 108, and the electrical element 109. The P-type transistor 105 and the N-type transistor 106 form a reset element 210. The source terminal, the drain terminal, and the gate terminal of the P-type transistor 105 are connected to the power supply terminal 101, the output terminal 104, and the reset terminal 103, respectively. A source terminal and a gate terminal of the N-type transistor 106 are connected to the ground terminal 102 and the reset terminal 103, respectively. One of two terminals included in the electrical element 109 is connected to the output terminal 104 and the drain terminal of the P-type transistor, and the other is connected to the drain terminal of the N-type transistor 106. Also, the first inverter 107 and the second inverter 108 form the latch element 111.

As the electrical element 109, an electrical resistor for which electrical insulation is possible by mechanical cutting by laser drawing, an electrical resistor or a diode for which electrical insulation is possible by thermal destruction by application of excess current, a phase change memory, a memory transistor including a floating gate, a memory transistor a MONOS structure, or the like is possible.

Next, an operation of the storage element is described. First a case where the electrical element 109 is electrically conductive is considered. In FIG. 2, "L" is applied to the reset terminal 103 when the wireless chip is reset. Since the P-type transistor 105 becomes electrically conductive and the N-type transistor 106 becomes electrically insulated, "H" is output to the output terminal 104. Also, at the same time, "H" is retained in the latch element 111. Subsequently, when "H" is applied to the reset terminal 103, the P-type transistor 105 becomes electrically insulated and the N-type transistor 106 becomes electrically conductive, "L" is output to the output terminal 104. Also, at the same time, information retained in the latch element 111 changes from "H" to "L." During operation of the wireless chip, if "H" is maintained in the reset terminal 103, the output terminal 104 will constantly output "L."

Now, a case where the electrical element 109 is electrically insulated is considered. Here, when the wireless chip is reset, "L" is applied to the reset terminal 103. Since the P-type transistor 105 becomes electrically conductive and the N-type transistor 106 becomes electrically insulated, "H" is output to the output terminal 104. Also, at the same time, "H" is retained in the latch element 111. Subsequently, when "H" is applied to the reset terminal 103, the P-type transistor 105 becomes eclectically insulated and the N-type transistor 106 becomes electrically conductive. Here, since the electrical element 109 is electrically insulated, information retained in the latch element 111 remains as "H." Consequently, "H" keeps being out to the output terminal 104. During operation of the wireless chip, if "H" is maintained in the reset terminal 103, the output terminal 104 will constantly output "H."

In the above manner, output of the storage element can be made to be "H" or "L" depending on whether the electrical element in the storage element is electrically insulated or conductive. Also, just by applying "L" to the reset terminal 103 in the beginning when a circuit operation is started, accessing time for reading information when reading thereafter is not required, and a special circuit such as a sense amplifier is not required.

Note that, although this embodiment mode shows a structure of connecting the electrical element 109 to be between the N-type transistor 106 and the output terminal 104, the structure may be that of connecting the electrical element to be between the P-type transistor 105 and the output terminal 104. In this case, output of the storage element can be made to be "L" or "H" depending on whether the electrical element is electrically insulated or conductive.

With the storage element forming the nonvolatile storage device that is mounted to the wireless chip of this embodiment mode, through current when resetting can be significantly reduced compared to the first embodiment mode; consequently, further reduction in power consumption is possible.

By having a structure such as the foregoing, a wireless chip with low power consumption mounted with a nonvolatile storage device can be provided at low cost. Also, an increase in a circuit scale of the nonvolatile storage device can be suppressed because stored information can be read from the nonvolatile storage device without requiring a special circuit for reading such as a sense amplifier; therefore, a wireless chip mounted with a nonvolatile storage device with even smaller area and lower power consumption can be provided.

Embodiments of the present invention will hereinafter be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiments to be given below. Note that in all drawings for describing the embodiments, the same reference numerals are used for the same portions or the portions having similar functions, and the repeated description thereof is omitted.

Embodiment 1

In this embodiment, an example of an electrical element that forms a nonvolatile storage device that is mounted to the wireless chip according to the present invention shown in Embodiment Mode 1 and Embodiment Mode 2 is described with reference to FIGS. 3A to 3C.

FIG. 3A is an example of forming an electrical element using an electrical resistor 301. A first terminal 302 and a second terminal 303 are electrically connected to the output terminal 104, and the ground terminal 102 of FIG. 1 described in Embodiment Mode 1, respectively. Also, the first terminal 302 and the second terminal 303 are electrically connected to the output terminal 104 and the N-type transistor 106 of FIG. 2 described in Embodiment Mode 2, respectively.

The electrical resistor 301 makes possible an electrical insulation by providing a region that is to be mechanically cut by laser drawing, and cutting this region by laser drawing. Also, the electrical resistor 301 makes possible an electrical insulation by applying excess current between the first terminal 302 and the second terminal 303 to cause thermal destruction. For the electrical resistor 301, a metal thin film, a conductive semiconductor thin film, a conductive organic thin film or the like can be used. Further, a phase change memory which changes an electrical resistance value by phase change may be used for the electrical resistor 301. By using a phase change memory, information which is stored in a nonvolatile storage device mounted to a wireless chip according to the present invention can be rewritten any number of times; therefore, further sophistication of the wireless chip is achieved.

Note that in this embodiment, although an example of carrying out electrical insulation by cutting the electrical resistance 301 is described, electrical insulation carried out according to the present invention is not limited to this structure. It is acceptable as long as the ground terminal 102 is electrically insulated from the output terminal 104 and the reset element 110. Therefore, the electrical element 109 may be insulated from the ground terminal 102, or the electrical element 109 may be insulated from the reset terminal 110 and the output terminal 104, for example.

By an electrical element including an electrical resistor, a wireless chip mounted with a nonvolatile storage device can be provided without increasing a layout area.

FIG. 3B is an example of forming an electrical element using a first diode 311 and a second diode 312. A first terminal 313 and a second terminal 314 are electrically connected to the output terminal 104 and the ground terminal 102 of FIG. 1 described in Embodiment Mode 1, respectively. Also, the first terminal 313 and the second terminal 314 are electrically connected to the output terminal 104 and the N-type transistor 106 of FIG. 2 described in Embodiment Mode 2, respectively.

The first terminal 313 and the second terminal 314 are electrically insulated from each other in an initial state. Here, when a high voltage is applied to the first terminal 313, the first diode 311 is thermally destroyed and becomes electrically conductive. At this time, by the first terminal 313 having a higher potential than the second terminal 314, the first terminal 313 and the second terminal 314 become electrically conductive.

By the electrical element including a diode, through current at operation can be substantially reduced; consequently, a wireless chip mounted with a nonvolatile storage device with further reduced current consumption can be provided.

FIG. 3C is an example of forming an electrical element using a floating gate memory transistor 321. Here, although an example of an N-type memory transistor as the floating gate memory transistor 321 is considered, it is also possible to use a P-type memory transistor. Further, other than a floating gate memory transistor, it is also possible to use a MONOS memory transistor.

A first terminal 322, a second terminal 323, and a third terminal 324 are electrically connected to the output terminal 104, the ground terminal 102, and the reset terminal 103 of FIG. 1 described in Embodiment Mode 1, respectively. Also, the first terminal 322, the second terminal 323, and the third terminal 324 are electrically connected to the output terminal 104, the N-type transistor 106, and the reset terminal 103 of FIG. 2 described in Embodiment Mode 2, respectively.

A threshold voltage of the floating gate memory transistor 321 can be changed in response to a charge amount that has accumulated to a floating gate. In other words, when the threshold voltage is high, the floating gate memory transistor 321 can become electrically insulated, and when the threshold voltage is low, it can be electrically conductive.

The threshold voltage of the floating gate memory transistor 321 can be increased, in other words the floating gate memory transistor 321 can be electrically insulated, by for example grounding the first terminal 322 and the second terminal 323 and applying a high voltage to the third terminal 324. Also, the threshold voltage of the floating gate memory transistor 321 can be reduced, in other words the floating gate memory transistor 321 can be electrically conductive, by grounding the first terminal 322 and the second terminal 323 and applying a negative high voltage to the third terminal 324.

By the electrical element including a floating gate memory transistor, rewriting is possible any number of times and through current at operation can be substantially reduced; therefore, a wireless chip mounted with a nonvolatile storage device that is more sophisticated and less current consuming can be provided.

By having a structure such as the foregoing, a wireless chip with low power consumption mounted with a nonvolatile storage device can be provided at low cost. Also, an increase in a circuit scale of the nonvolatile storage device can be suppressed because stored information can be read from the nonvolatile storage device without requiring a special circuit for reading such as a sense amplifier; therefore, a wireless chip mounted with a nonvolatile storage device with even less area and lower power consumption can be provided.

Embodiment 2

Figure 16:
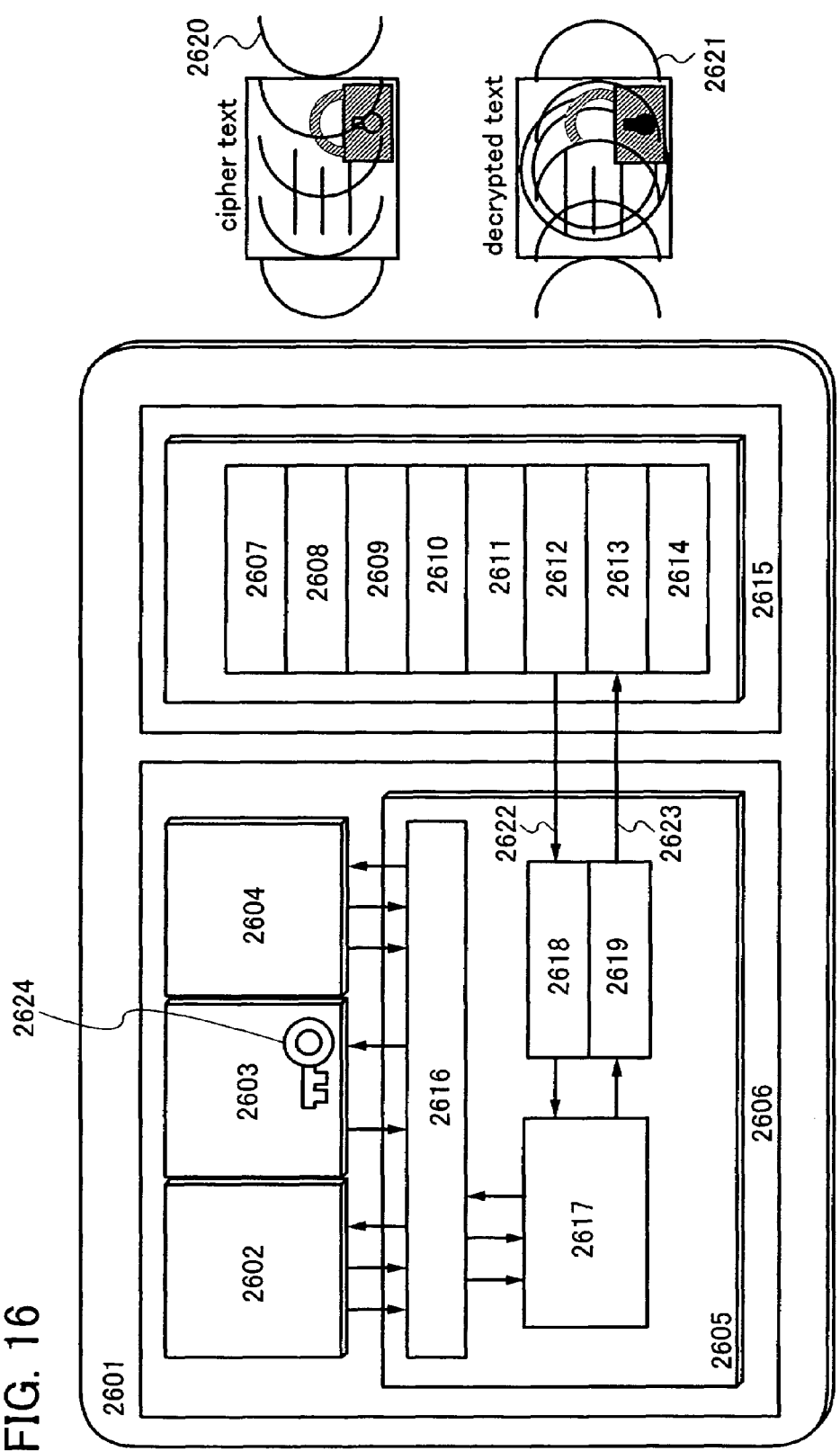
FIG. 16 shows a structural example of a semiconductor device according to the present invention.
Figure 17:
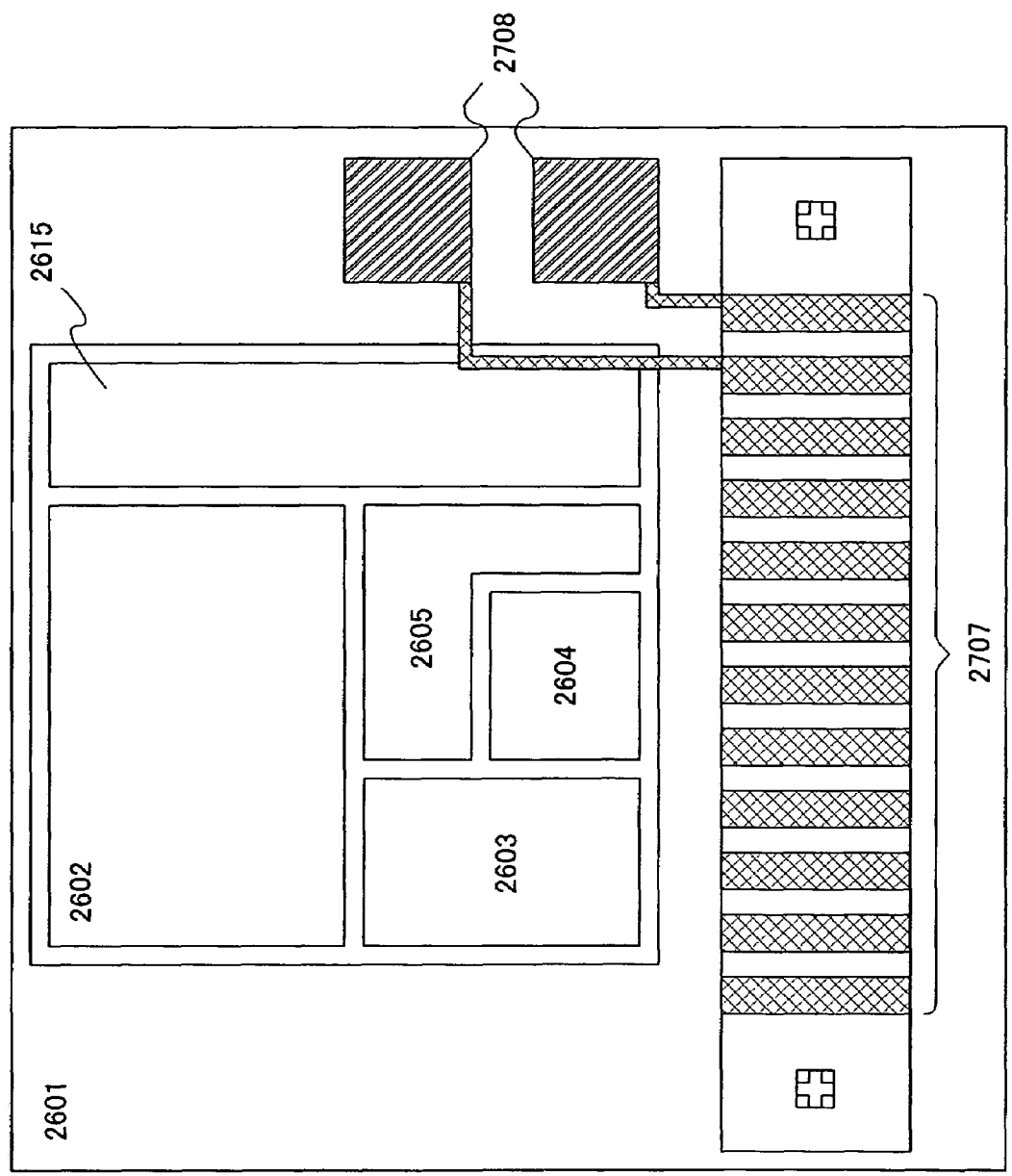
FIG. 17 shows a layout example of a semiconductor device according to the present invention.

In this embodiment, as an example of a semiconductor device according to the present invention, a wireless chip having a cipher processing function is described using FIGS. 16 and 17. FIG. 16 is a block diagram of the wireless chip and FIG. 17 is a layout diagram of the wireless chip.

First, a block structure of the wireless chip is described using FIG. 16. In FIG. 16, a wireless chip 2601 includes an arithmetic circuit 2606 which includes a CPU 2602, a ROM 2603, a RAM 2604 and a controller 2605; and an analog portion 2615 which includes an antenna 2607, a resonance circuit 2608, a power supply circuit 2609, a reset circuit 2610, a clock generating circuit 2611, a demodulation circuit 2612, a modulation circuit 2613, and a power supply managing circuit 2614. The controller 2605 includes a CPU interface (IF) 2616, a control register 2617, a code extracting circuit 2618, and an encoding circuit 2619. Note that although in FIG. 16, a communication signal is shown separated into a reception signal 2620 and a transmission signal 2621 for simplification of the description, they actually overlap each other and are transmitted and received simultaneously between the wireless chip 2601 and a reader/writer. The reception signal 2620 is demodulated by the demodulation circuit 2612 after they are received by the antenna 2607 and the resonance circuit 2608. Also, the transmission signal 2621 is transmitted from the antenna 2607 after it is modulated by the modulation circuit 2613.

In FIG. 16, by placing the wireless chip 2601 in a magnetic field formed by the communication signal, induced electromotive force is caused by the antenna 2607 and the resonance circuit 2608. The induced electromotive force is retained by a capacitance in the power supply circuit 2609, and its potential is stabilized also by the capacitance, and is supplied to each circuit of the wireless chip 2601 as a power supply voltage. The reset circuit 2610 generates an initial reset signal of the entire wireless chip 2601.

For example, a signal that rises after an increase in power supply voltage is generated as the reset signal. The clock generating circuit 2611 changes a frequency and a duty ratio of a clock signal, in response to a control signal generated by the power supply managing circuit 2614. The demodulation circuit 2612 detects a shift in amplitude of the reception signal 2620 of an ASK method (amplitude modulation method) as reception data 2622 of "0"/"1." The demodulation circuit 2612 may be for example a low-pass filter.

Further, the modulation circuit 2613 transmits transmission data by shifting amplitude of the transmission signal 2621 of an ASK method. For example, when transmission data 2623 is "0," amplitude of a communication signal is changed by changing a resonance point of the resonance circuit 2608. The power supply managing circuit 2614 monitors power supply voltage supplied to the arithmetic circuit 2606 by the power supply circuit 2609 or consumption current in the arithmetic circuit 2606, and generates a control signal in the clock generating circuit 2611 for changing the frequency and the duty ratio of the clock signal.

An operation of the wireless chip of this embodiment is described. First, the wireless chip 2601 receives a reception signal 2620 including cipher text data that is transmitted from a reader/writer. The reception signal 2620 is broken up into a control command, cipher text data, and the like in the code extracting circuit 2618 after it is demodulated in the demodulation circuit 2612, and stored in the control register 2617. Here, the control command is data which specifies a response of the wireless chip 2601. For example, the control demand specifies transmission of a specific ID number, stopping of operation, cipher breaking, or the like. Here, a control command for cipher breaking is received.

Subsequently, in the arithmetic circuit 2606, the CPU 2602 deciphers (decrypts) a cipher text using a secret key 2624 that is stored in the ROM 2603 in advance, according to a cipher breaking program stored in the ROM 2603.

The decrypted cipher text (decrypted text) is stored in the control register 2617. At this time, the RAM 2604 is used for a data storing region. Note that the CPU 2602 accesses the ROM 2603, the RAM 2604, and the control register 2617 via the CPUIF 2616. The CPUIF 2616 has a function of generating an access signal with respect to any of the ROM 2603, the RAM 2604, and the control register 2617, from an address demanded by the CPU 2602.

Lastly, in the encoding circuit 2619, the transmission data 2623 is generated from the decrypted text and is modulated in the modulation circuit 2613, and the transmission signal 2621 is transmitted to the reader/writer from the antenna 2607.

Note that in this embodiment, as an arithmetic method, a method of processing using software, in other words a method in which an arithmetic circuit includes a CPU and a large scale memory, and carries out a program with the CPU is described; however, the most appropriate arithmetic method can be selected depending on a purpose, and the arithmetic circuit can be structured according to the method. For example, as the arithmetic method, a method of processing an arithmetic calculation using hardware, and a method of combining hardware and software can be considered. In the method of processing an arithmetic calculation using hardware, the arithmetic circuit may include a dedicated circuit. In the method of combining hardware and software, the arithmetic circuit may include a dedicated circuit, a CPU, and a memory, and part of an arithmetic process may be carried out in the dedicated circuit and a program of the rest of the arithmetic process may be carried out in the CPU.

Subsequently, a layout structure of the wireless chip is described with reference to FIG. 17. Note that in FIG. 17, the same reference numerals are used to indicate portions that correspond to FIG. 16, and descriptions thereof are omitted.

In FIG. 17, an FPC pad 2707 is an electrode pad group that is used when an FPC (Flexible Print Circuit) is attached to the wireless chip 2601. An antenna bump 2708 is an electrode pad to which an antenna (not shown) is attached. Note that when the antenna is attached, there is a possibility that excessive pressure is applied to the antenna bump 2708. Therefore, it is desirable that a component that forms a circuit such as a transistor is not placed under the antenna bump 2708.

Note that in this embodiment, although a structure of externally attaching the antenna is described, the structure may be that of a so-called on-chip antenna, where the antenna is directly formed on the wireless chip 2601. This is effective in size reduction of the wireless chip.

Further, it is effective to use the FPC pad 2707 mainly during failure analysis. Since the wireless chip obtains power supply voltage from a communication signal, in a case where a failure has occurred in the antenna or the power supply circuit for example, the arithmetic circuit does not operate at all. Therefore, failure analysis becomes especially difficult. However, by supplying power supply voltage to the wireless chip 2601 from the FPC via the FPC pad 2707, as well as inputting an arbitrary electrical signal instead of an electrical signal supplied by the antenna, operation of the arithmetic circuit becomes possible. Consequently, failure analysis can be carried out efficiently.

Also, it is further effective to place the FPC pad 2707 in a position where measurement using a prober is possible. In other words, in the FPC pad 2707, by placing the electrode pads according to a pitch of a prober needle, measurement by a prober becomes possible. By using a prober, man-hour in attaching the FPC during failure analysis can be reduced. Also, since measurement can be carried out even in a state where a plurality of wireless chips are formed over a substrate, man-hour for dividing into individual wireless chips can also be reduced. Further, during mass production, product inspection can be carried out right before a step of attaching the antenna. Consequently, since defective items can be sorted out in an early step, manufacturing cost can be reduced.

Note that the nonvolatile storage device including an electrical element described in Embodiment Mode 1, Embodiment Mode 2, and Embodiment 1 can be incorporated to the ROM 2603 of this embodiment.

Embodiment 3

In this embodiment, a case where a semiconductor device of the present invention includes a thin film transistor (TFT) is described with reference to FIGS. 5A and 5B.

Figure 5A:
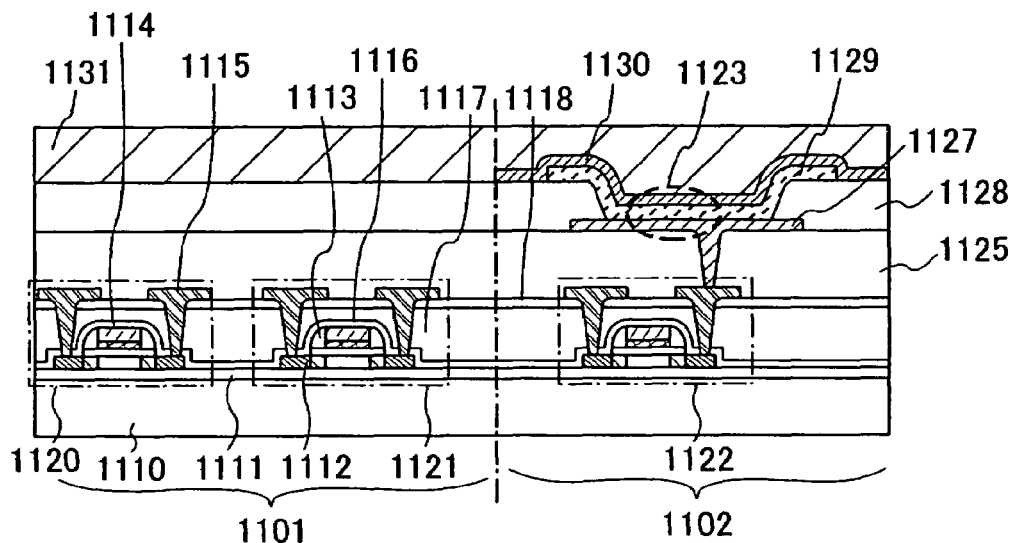
FIGS. 5A and 5B are each a cross-sectional diagram of a semiconductor device according to the present invention.

FIG. 5A shows a cross-sectional view of a TFT portion 1101 and a memory portion 1102 formed over an insulating substrate 1110. The TFT portion 1101 may be used for example for a transistor of an arithmetic circuit. The memory portion 1102 may be used for example for a memory element of a nonvolatile memory. As the insulating substrate 1110, a glass substrate, a quartz substrate, a substrate made of silicon, a metal substrate, a plastic substrate, or the like can be used.

Also, when a glass substrate is used, one that is thinned by polishing a side opposite a side over which a TFT or the like is formed can be used. With such a thin glass substrate, reduction in weight and thinning of a device can be achieved.

A base film 1111 is provided over the insulating substrate 1110. At the TFT portion 1101, thin film transistors 1120 and 1121 are provided over the insulating substrate 1110 with the base film 1111 interposed therebetween, and at the memory portion 1102, a thin film transistor 1122 is provided over the insulating substrate 1110 with the base film 1111 interposed therebetween. Each of the thin film transistors includes a semiconductor film 1112 processed into an island-shape, a gate electrode 1114 provided via a gate insulating film, and an insulator (so-called sidewall) 1113 provided over a side surface of the gate electrode. The semiconductor film 1112 is formed so as to have a thickness of 0.2 μm or less, typically from 40 nm to 170 nm, and preferably from 50 nm to 150 nm. Further, each of the thin film transistors includes an insulating film 1116 covering the insulator (sidewall) 1113 and the semiconductor film 1112, and an electrode 1115 connected to an impurity region formed in the semiconductor film 1112. Note that the electrode 1115 connecting with the impurity region can be formed by forming a contact hole in a gate insulating film and the insulating film 1116, forming a conductive film in the contact hole and processing the conductive film into a desired form.

For a thin film transistor forming a wireless chip according to the present invention, an insulating film typified by a gate insulating film or the like can be manufactured using a high density plasma treatment. A high density plasma treatment is a plasma treatment using a high frequency wave with a plasma density of $1 \times 10^{11}$ cm$^{-3}$ or higher, preferably from $1 \times 10^{11}$ cm$^{-3}$ to $9 \times 10^{15}$ cm$^{-3}$ such as a microwave (for example frequency of 2.45 GHz). When plasma is generated under such condition, low electron temperature is 0.2 eV to 2 eV. Since kinetic energy of active species is low for high density plasma of which low electron temperature is a characteristic, a film with little plasma damage and few defects can be formed. In a film formation chamber in which such plasma treatment is possible, a formation object, or if forming a gate insulating film, a substrate over which a semiconductor film processed into a desired shape is formed, is placed. Then, a film formation process is carried out with a distance between an electrode for plasma generation, in other words an antenna, and the formation object being 20 mm to 80 mm, preferably 20 mm to 60 mm. With such high density plasma treatment, realizing a low temperature process (substrate temperature of 400° C. or lower) becomes possible. Consequently, plastic with a low heat resistance can be formed over a substrate.

Film formation atmosphere for such an insulating film can be a nitrogen atmosphere or an oxygen atmosphere. The nitrogen atmosphere is typically a mixed atmosphere of nitrogen and a rare gas, or a mixed atmosphere of nitrogen, hydrogen and a rare gas. As the rare gas, at least one of helium, neon, argon, krypton, and xenon can be used. Also, the oxygen atmosphere is typically a mixed atmosphere of oxygen and a rare gas, a mixed atmosphere of oxygen, hydrogen and a rare gas, or a mixed atmosphere of dinitrogen monoxide and a rare gas. As the rare gas, at least one of helium, neon, argon, krypton, and krypton can be used.

An insulating film formed in such a manner is dense and does not damage another film very much. Also, for an insulating film formed by the high density plasma treatment, a state of an interface that is in contact with the insulating film can be improved. For example, by forming a gate insulating film using the high density plasma treatment, a state of an interface with a semiconductor film can be improved. As a result, an electrical characteristic of a thin film transistor can be improved.

Although a case of using the high density plasma treatment in manufacturing an insulating film is described, the high density plasma treatment may be carried out on a semiconductor film. By the high density plasma treatment, a semiconductor film surface can be modified. As a result, a state of an interface can be improved, and further, an electrical characteristic of a thin film transistor can be improved.

Further, in order to enhance flatness, insulating films 1117 and 1118 are preferably provided. The insulating film 1117 and the insulating film 1118 are preferably formed of an organic material and an inorganic material, respectively. When the insulating films 1117 and 1118 are provided, the electrode 1115 can be formed so as to be connected to the impurity region via a contact hole in the insulating films 1117 and 1118.

Furthermore, an insulating film 1125 is provided, and a lower electrode 1127 is formed so as to be connected to the electrode 1115. Also, an insulating film 1128 is formed, which covers an end portion of the lower electrode 1127, and which is provided with an opening so as to expose the lower electrode 1127. A memory material layer 1129 is formed in the opening, and then an upper electrode 1130 is formed. In this manner, a memory element 1123 including the lower electrode 1127, the memory material layer 1129, and the upper electrode 1130 is formed.

The memory material layer 1129 is formed of an organic compound of which conductivity changes by an electrical effect or an optical effect, an inorganic insulator, or a layer of a mixture of an organic compound and an inorganic compound. The memory material layer 1129 may be provided as a single layer or as stacked layers of a plurality of layers. Also, the memory material layer 1129 may be provided by stacking the mixed layer of an organic compound and an inorganic compound, and a layer made of an organic compound of which conductivity changes by an electrical effect or an optical effect.

For the inorganic insulator which can form the memory material layer 1129, silicon oxide, silicon nitride, silicon oxynitride, silicon nitride oxide, or the like can be used.

For an organic insulator which can form the memory material layer 1129, an organic resin typified by polyimide, acrylic, polyamide, benzocyclobutene, epoxy, or the like can be used.

Also, for the organic compound of which conductivity changes by an electrical effect or an optical effect that can structure the memory material layer 1129, an organic compound material having a high hole transporting property or an organic compound material having a high electron transporting property can be used.

For the organic compound material having a high hole transporting property, an aromatic amine based compound (i.e., one having a benzene ring-nitrogen bond), such as 4,4'-bis[N-(1-naphthyl)-N-phenylamino]biphenyl (abbreviation.: α-NPD), 4,4'-bis[N-(3-methylphenyl)-N-phenylamino]biphenyl (abbreviation.: TPD), 4,4',4"-tris(N,N-diphenylamino)triphenylamine (abbreviation.: TDATA); 4,4',4"-tris

[N-(3-methylphenyl)-N-phenylamino]triphenylamine (abbreviation.: MTDATA), or 4,4'-bis{N-[4-(N,N-di-m-tolylamino)phenyl]-N-phenylamino}biphenyl (abbreviation: DNTPD); or a phthalocyanine compound such as phthalocyanine (abbreviation: $H_2Pc$), copper phthalocyanine (abbreviation: CuPc) or vanadyl phthalocyanine (abbreviation: VOPc) can be used. Substances mentioned here are mostly substances having a hole mobility of $10^{-6}$ cm$^2$/Vs or higher. However, a substance other than the foregoing may be used as long as it is a substance having higher hole mobility than electron mobility.

For an inorganic compound material that easily accepts electrons, a metal oxide, a metal nitride, or a metal oxynitride of any transition metal in group 4 to group 12 of the periodic table can be used. Specifically, titanium oxide (TiOx), zirconium oxide (ZrOx), vanadium oxide (VOx), molybdenum oxide (MoOx), tungsten oxide (WOx), tantalum oxide (TaOx), hafnium oxide (HfOx), niobium oxide (NbOx), cobalt oxide (CoOx), rhenium oxide (ReOx), ruthenium oxide (RuOx), zinc oxide (ZnO), nickel oxide (NiOx), copper oxide (CuOx) or the like can be used. Note that although an oxide of a metal is given as an example here, needless to say, a nitride or an oxynitride of the metal may be used.

As an organic compound material having a high electron transporting property, a material made of a metal complex or the like having a quinoline skeleton, or a benzoquinoline skeleton, such as tris(8-quinolinolato)aluminum (abbreviation: Alq3), tris(4-methyl-8-quinolinolato)aluminum (abbreviation: Almq3), bis(10-hydroxybenzo[h]-quinolinato)beryllium (abbreviation: BeBq2), and bis(2-methyl-8-quinolinolato)-4-phenylphenolato-aluminum (abbreviation: BAlq) can be used. In addition, a material such as a metal complex having an oxazole-based or thiazole-based ligand such as bis[2-(2-hydroxyphenyl)-benzoxazolato]zinc (abbreviation: Zn(BOX)$_2$) or bis[2-(2-hydroxyphenyl)-benzothiazolato]zinc (abbreviation: Zn(BTZ)$_2$) can be used. Further, other than a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)$_4$-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. Substances mentioned here are mostly substances having an electron mobility of $10^{-6}$ cm$^2$/Vs or higher. However, a substance other than the foregoing may be used as long as it is a substance having higher electron mobility than hole mobility.

For an inorganic compound material that easily gives electrons, an alkali metal oxide, an alkali earth metal oxide, a rare-earth metal oxide, an alkali metal nitride, an alkali earth metal nitride, or a rare-earth metal nitride can be used. Specifically, lithium oxide, (LiOx), strontium oxide (SrOx), barium oxide (BaOx), erbium oxide (ErOx), sodium oxide (NaOx), lithium nitride (LiNx), magnesium nitride (MgNx), calcium nitride (CaNx), yttrium nitride (YNx), lanthanum nitride (LaNx), or the like can be used.

Further, for an inorganic compound material, other than aluminum oxide (AlOx), gallium oxide (GaOx), silicon oxide (SiOx), germanium oxide (GeOx), indium tin oxide (hereinafter referred to as ITO), or the like, a variety of metal oxides, metal nitrides, or metal oxynitrides can be used.

Also, when the memory material layer 1129 is formed of a compound having a high hole transporting property and a compound selected from metal oxides or metal nitrides, a structure may be that a compound with a large steric barrier (having a structure that expands three dimensionally unlike a planar structure) is added additionally. For the compound with the large steric barrier, 5,6,11,12-tetraphenyltetracene (abbreviated: rubrene) is preferable. However, other than this, hexaphenylbenzene, t-butylperylene, 9,10-di(phenyl)anthracene, coumarin 545T or the like can be used. In addition, dendrimer or the like is also effective.

Furthermore, between a layer formed of the organic compound material having a high electron transporting property and a layer formed of the organic compound material having a high hole transporting property, a light emitting substance such as the following may be provided: 4-dicyanomethylene-2-methyl-6-[2-(1,1,7,7-tetramethyljulolidine-9-yl)ethenyl]-4H-pyran (abbreviation: DCJT); 4-dicyanomethylene-2-t-butyl-6-(1,1,7,7-tetramethyljulolidyl-9-enyl)-4H-pyran; periflanthene; 2,5-dicyano-1,4-bis(10-methoxy-1,1,7,7-tetramethyljulolidyl-9-enyl)benzene; N,N'-dimethylquinacridon (abbreviation: DMQd); coumarin 6; coumarin 545T; tris(8-quinolinolato)aluminum (abbreviation: Alq$_3$); 9,9'-bianthryl; 9,10-diphenylanthracene (abbreviation: DPA); 9,10-bis(2-naphthyl)anthracene (abbreviation: DNA); or 2,5,8,11-tetra-t-butylperylene (abbreviation: TBP).

Also, for the memory material layer 1129, a material that changes electrical resistance by an optical effect can be used. For example, a conjugate polymer doped with a compound that generates acid by absorbing light (photoacid generator) can be used. For the conjugate polymer, polyacetylenes, polyphenylene vinylenes, polythiophenes, polyanilines, polyphenylene ethinylenes, or the like can be used. Further, as the photoacid generator, aryl sulfonium salt, aryl iodonium salt, o-nitrobenzyl tosylate, aryl sulfonic acid p-nitrobenzyl ester, sulfonyl acetophenones, Fe-arene complex PF$_6$ salt, or the like can be used.

Note that for the memory material layer 1129, a phase change material such as a material that reversibly changes between a crystalline state and an amorphous state, or a material that reversibly changes between a first crystalline state and a second crystalline state can be used. Also, a material that only changes from an amorphous state to a crystalline state can be used.

The material that reversibly changes between a crystalline state and an amorphous state is a material containing a plurality of elements selected from germanium (Ge), tellurium (Te), antimony (Sb), sulphur (S), tellurium oxide (TeOx), tin (Sn), gold (Au), gallium (Ga), selenium (Se), indium (In), thallium (Ti), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used. The material which reversibly changes between the first crystalline state and the second crystalline state is a material containing a plurality of elements selected from silver (Ag), zinc (Zn), copper (Cu), aluminum (Al), nickel (Ni), indium (In), antimony (Sb), selenium (Se), and tellurium (Te), for example, Ag—Zn, Cu—Al—Ni, In—Sb, In—Sb—Se, or In—Sb—Te. When using this material, a phase change is carried out between two different crystalline states. The material which changes only from an amorphous state to a crystalline state is a material containing a plurality of elements selected from tellurium (Te), tellurium oxide (TeOx), palladium (Pd), antimony (Sb), selenium (Se), and bismuth (Bi), for example, Te—TeO$_2$, Te—TeO$_2$—Pd, or Sb$_2$Se$_3$/Bi$_2$Te$_3$.

The memory material layer 1129 can be formed using an evaporation method, an electron beam evaporation method, a sputtering method, a CVD method, or the like. Also, the mixed layer including an organic compound and an inorganic compound can be formed by simultaneously forming a material of each of the organic compound and the inorganic compound. The mixed layer including the organic compound and the inorganic compound can be formed by combining the same type of methods or different types of methods, such as a co-evaporation method by resistance heating evaporations, a co-evaporation method by electron beam evaporations, a co-evaporation method by resistance heating evaporation and electron beam evaporation, formation by resistance heating evaporation and sputtering, or formation by electron beam evaporation and sputtering.

Note that the memory material layer 1129 is formed to have a thickness with which conductivity of a storage element changes by an electrical effect or an optical effect.

The lower electrode 1127 or the upper electrode 1130 can be formed of a conductive material. For example, the lower electrode 1127 or the upper electrode 1130 can be formed of a film made of the following element: aluminum (Al), titanium (Ti), molybdenum (Mo), tungsten (W), or silicon (Si). Alternatively, the lower electrode 1127 or the upper electrode 1130 can be formed of an alloy film or the like using such element. Also, a light transmitting material can be used, such as indium tin oxide (ITO), indium tin oxide containing silicon oxide, or an oxide conductive material formed using a target of indium oxide mixed with 2 to 20 wt % zinc oxide (ZnO).

In order to further enhance flatness and to prevent entrance of an impurity element, an insulating film 1131 may be formed.

For the insulating film described in this embodiment, an inorganic material or an organic material can be used. Silicon oxide or silicon nitride can be used for the inorganic material. For the organic material, polyimide, acrylic, polyamide, polyimide amide, a resist, benzocyclobutene, siloxane, or polysilazane can be used. Note that a siloxane resin corresponds to a resin including a Si—O—Si bond. A skeleton structure of siloxane includes a bond between silicon (Si) and oxygen (O). For a substituent, an organic group containing at least hydrogen (for example, an alkyl group or an aromatic hydrocarbon) is used. For the substituent, a fluoro group may be used. Also, an organic group containing at least hydrogen and a fluoro group may be used for the substituent. Polysilazane is formed with a polymer material having a bond between silicon (Si) and nitrogen (N) as a starting material.

Figure 5B:
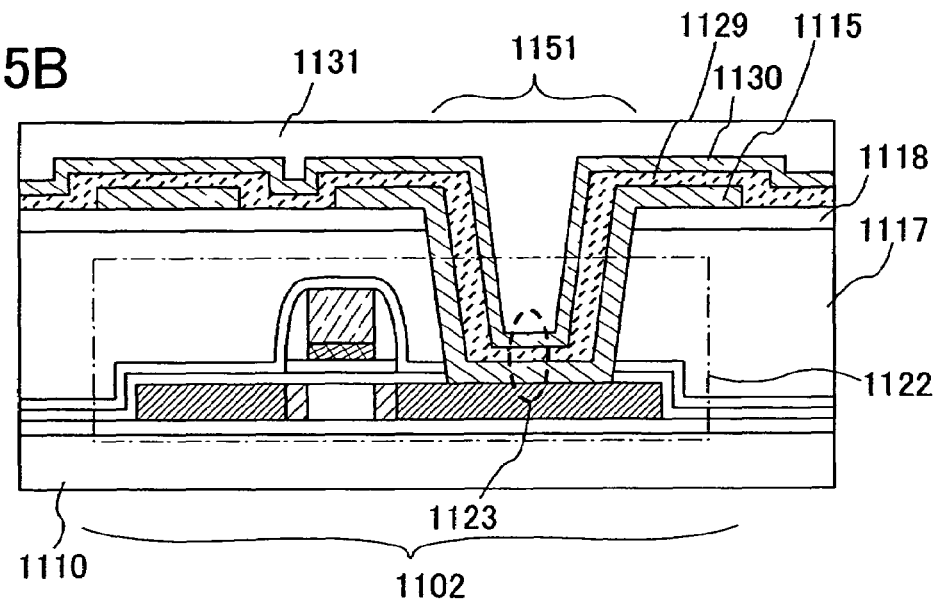

FIG. 5B is different from FIG. 5A, and shows a cross-sectional view of a memory for which a memory material layer is formed in a contact hole 1151 of the electrode 1115. In a similar manner to FIG. 5A, the electrode 1115 is used as a lower electrode, and the memory material layer 1129 and the upper electrode 1130 are formed over the electrode 1115 to form the memory element 1123. Subsequently, the insulating film 1131 is formed. The rest of the structure of FIG. 5B is similar to that of FIG. 5A; therefore, description thereof is omitted.

In this manner, by forming a memory element in the contact hole 1151, size reduction of the memory element can be achieved. Also, since an electrode for a memory is not necessary, a manufacturing process can be shortened, and a wireless chip mounted with a memory can be provided at low cost.

As in the foregoing, by a semiconductor device including a thin film transistor that uses as an activation layer a semiconductor thin film formed over a substrate having an insulating surface such as a glass substrate, a quartz substrate, or a plastic substrate, a high performance and low power consumption semiconductor device can be provided with a lighter weight and at a lower price.

This embodiment can be applied in free combination with Embodiment Mode 1, Embodiment Mode 2, Embodiment 1, and Embodiment 2.

Embodiment 4

Figure 6:
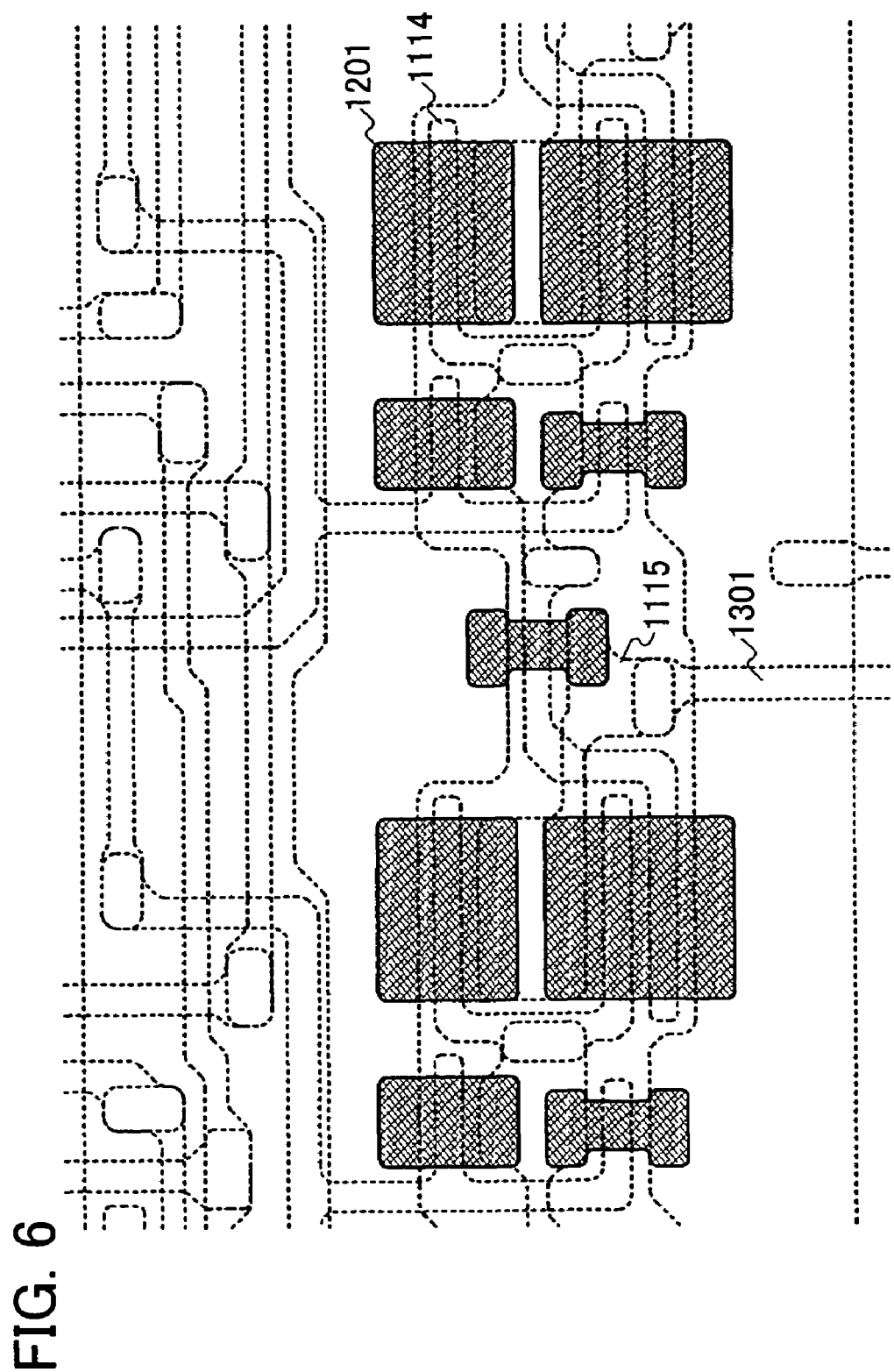
FIG. 6 shows a layout of a semiconductor device according to the present invention (semiconductor layer)
Figure 7:
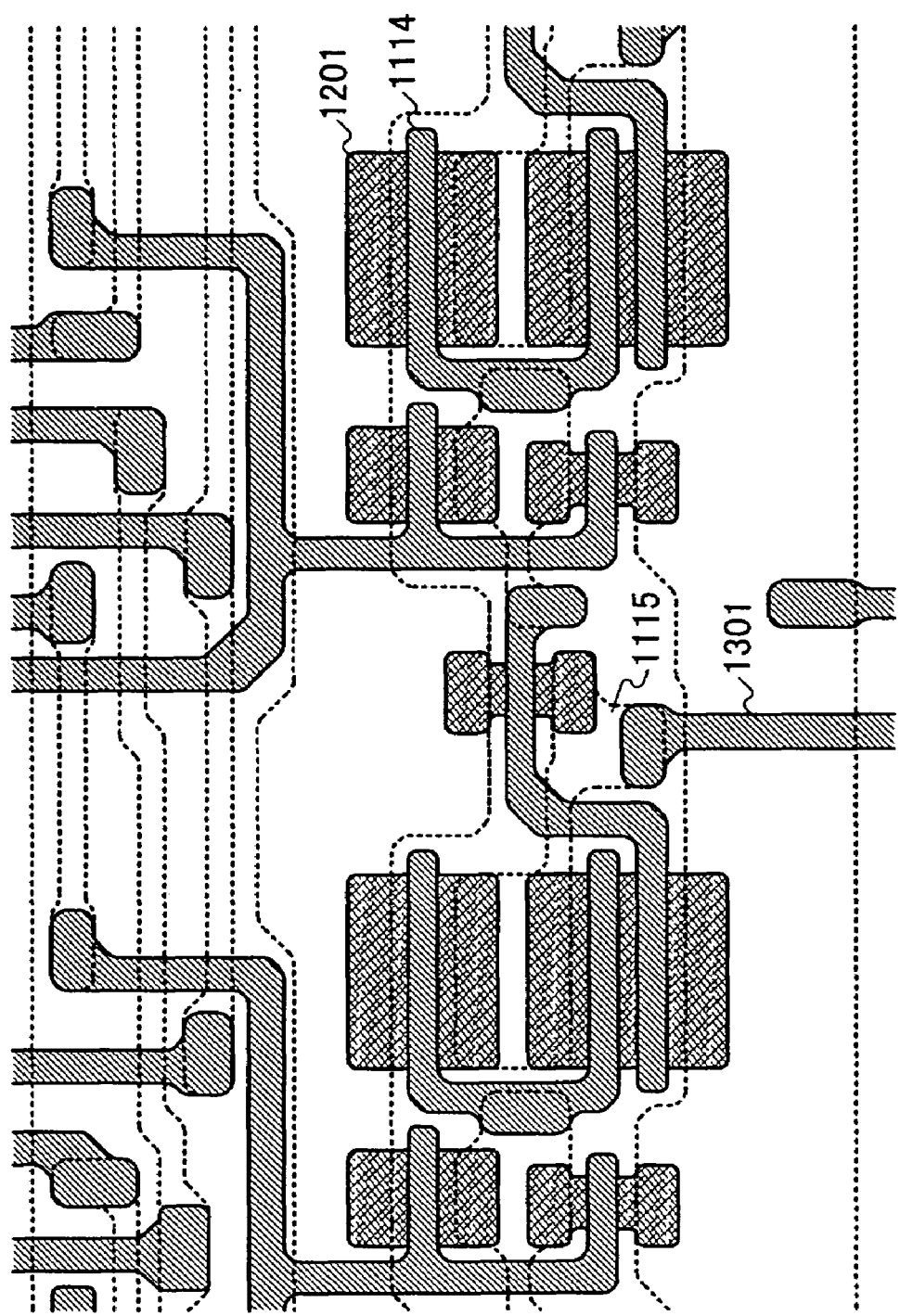
FIG. 7 shows a layout of a semiconductor device according to the present invention (gate wiring)

In this embodiment, a layout of a thin film transistor that partly forms a circuit in a semiconductor device according to the present invention is described with reference to FIGS. 6 to 8.

A semiconductor layer that corresponds to the semiconductor film 1112 described in Embodiment 3 is formed over an entire surface or a part of a surface (a region having a larger area than a region that is confirmed as a semiconductor region of a transistor) of a substrate having an insulating surface, with a base film or the like interposed therebetween. Then, a mask pattern is formed over the semiconductor layer by a photolithographic technique. By using this mask pattern to carry out an etching treatment on the semiconductor layer, an island-shaped semiconductor pattern 1201 shown in FIG. 6 having a specific shape that includes a source region, a drain region, and a channel forming region of a thin film transistor can be formed.

The shape of the semiconductor layer that is formed into a pattern is determined taking into consideration the appropriateness of a circuit characteristic or a layout, based on a characteristic of the thin film transistor.

For the thin film transistor that forms a circuit of a wireless chip according to the present invention, a photomask for forming the semiconductor layer is provided with a pattern. This pattern of the photomask has a corner portion and a right triangle in the corner portion having a side with a length of 10 μm or shorter is removed, and the corner portion is rounded. The shape of this mask pattern can be transferred as a pattern shape of the semiconductor layer as shown in FIG. 6. The mask pattern may be transferred to the semiconductor layer so that the corner portion of the semiconductor pattern 1201 is more rounded than the corner portion of the photomask pattern. In other words, the corner portion of the pattern of the semiconductor film may have a pattern shape which is more smoothly rounded than the photomask pattern. Note that in FIG. 6, the gate electrode 1114, a gate wiring 1301, the electrode 1115 to be formed later are indicated by a dotted line.

Subsequently, a gate insulating film is formed over the semiconductor layer which is patterned to have a rounded corner portion. Then, as described in Embodiment 3, the gate electrode 1114 which partially overlaps with the semiconductor layer, and the gate wiring 1301 are formed at the same time. The gate electrode or the gate wiring can be formed by forming a metal layer or a semiconductor layer, and carrying out photolithography.

A photomask for forming this gate electrode or gate wiring has a pattern. This pattern of the photomask has a corner portion, and a right triangle formed in the corner portion having a side with a length of 10 μm or less, or a length that is ⅕ to ½ of a wiring width is removed. The shape of this mask pattern can be transferred as a pattern shape of the gate electrode or the gate wiring, as shown in FIG. 7. The mask pattern may be transferred to the gate electrode or the gate wiring so that the corner portion of the gate electrode or the gate wiring is more rounded. In other words, the gate electrode or the gate wiring may have a pattern with a corner portion that is a more smoothly rounded shape than the corner portion of the photomask pattern.

In a corner portion of the gate electrode or the gate wiring formed using such a photomask, a right triangle in the corner portion having a side with a length that is ⅕ to ½ of a wiring width is removed, and the corner can be rounded. Note that in FIG. 7, the electrode 1115 formed later is shown by a dotted line.

Such a gate electrode or gate wiring is bent into a rectangle because of a layout limitation. Therefore, a rounded corner portion of the gate electrode or gate wiring is provided with a projection (an outer side) and a depression (an inner side). At this round projection, it is possible to suppress generation of fine powder due to abnormal discharge during dry plasma etching. In addition, at the round depression, even if there is fine powder generated, the fine powder which tends to collect at the corner portion can be washed away during washing. As a result, there is an effect that yield can be improved.

Subsequently, insulating layers and the like corresponding to the insulating films 1116, 1117, and 1118 are formed over the gate electrode or gate wiring as described in foregoing Embodiment 3. Of course, the insulating layers may be a single layer in the present invention.

Then, over the insulating layer, an opening is formed in a predetermined position of the insulating film, and in the opening, a wiring corresponding to the electrode 1115 is formed. This opening is provided to electrically connect the semiconductor layer or the gate wiring layer which is in the lower layer and the wiring layer to each other. For the wiring, a mask pattern is formed by photolithography, and the wiring is formed into a predetermined pattern by an etching process.

With the wiring, certain elements can be connected. The wiring does not connect certain elements in a straight line, but bends into a rectangle due to the layout limitation (hereinafter referred to as a bend portion). Also, a wiring width of the wiring can change in the opening or in another region. For example, in the opening, when the opening is about the same as or larger than the wiring width, the wiring width changes by expanding. Also, since the wiring also functions as one electrode of a capacitor portion due to a layout of a circuit, the wiring width may be large.

In this case, at the bend portion of the photomask pattern, a right triangle formed at the bend portion having a side with a length of 10 μm or less, or a length that is ⅕ to ½ of a wiring width is removed. Then, as shown in FIG. 8, the pattern of the wiring is rounded in a similar manner. In a corner portion of the wiring, a right triangle in the corner portion having a side with a length that is ⅕ to ½ of a wiring width is removed, and the bend portion can be rounded. Then, as shown in FIG. 8, the pattern of the wiring is rounded in a similar manner. For such a rounded wiring, a projection of a bend portion thereof can suppress generation of fine powder due to abnormal discharge during dry plasma etching, and at a depression the fine powder that tends to collect at the corner portion is washed away during washing, even if there is fine powder generated. As a result, there is an effect that yield can be improved. By rounding the corner portion of the wiring, it can also be electrically conductive.

Figure 8:
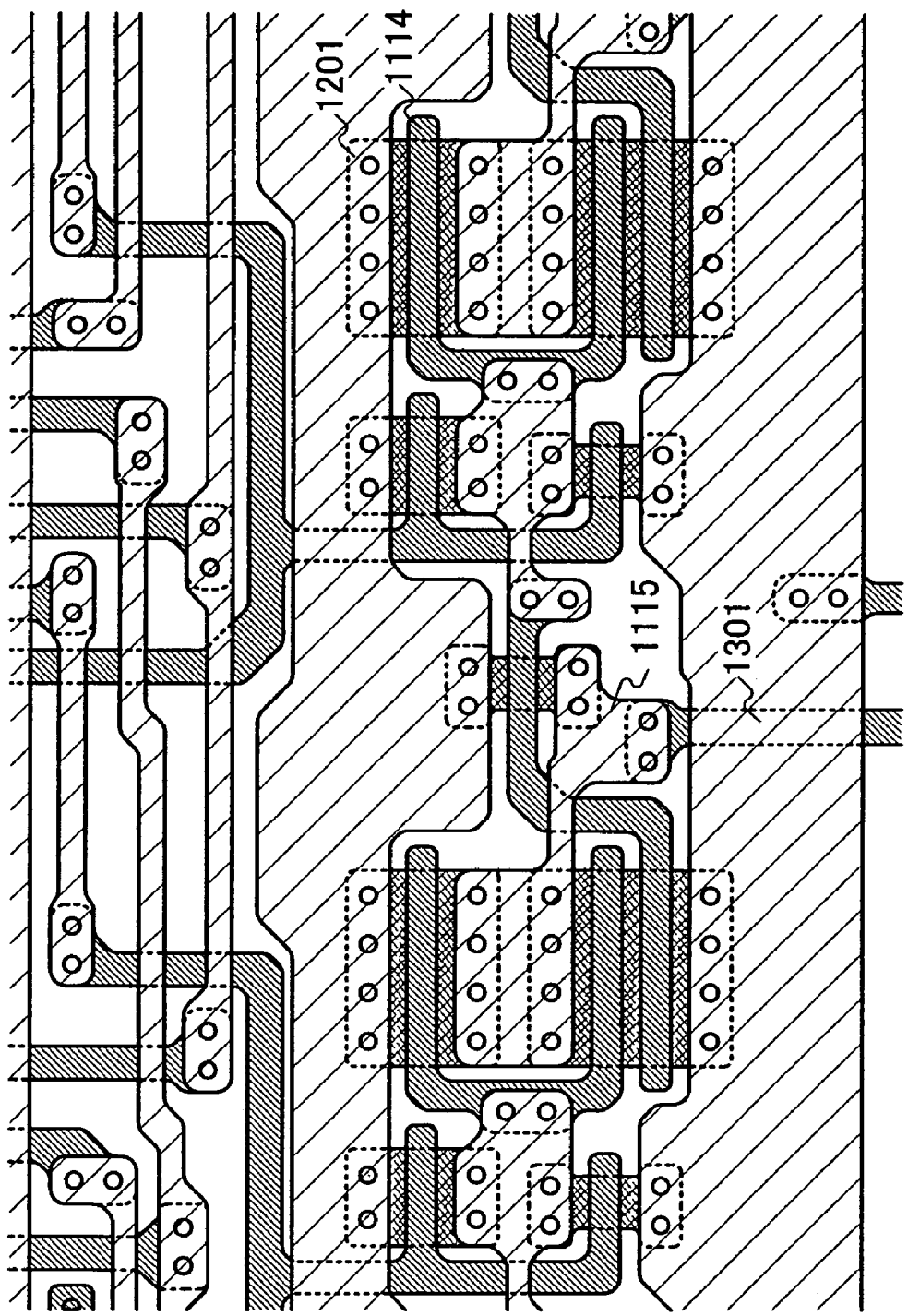
FIG. 8 shows a layout of a semiconductor device according to the present invention (wiring)

In a circuit having the layout shown in FIG. 8, by smoothing and rounding a corner portion of a bend portion or a part where the wiring width changes, there are effects that generation of fine powder due to abnormal discharge can be suppressed during dry plasma etching, and that even if there is fine powder which collects easily in the corner, it can be washed away during washing, and as a result yield can be improved. In other words, problems of dust and fine powder during a manufacturing step can be solved. Also, by rounding the corner portion of the wiring, it can also be electrically conductive. In particular, it is extremely favorable that dust can be washed away for a wiring of a driver circuit portion or the like in which a plurality of parallel wirings are provided.

Note that in this embodiment, a mode where a corner portion or a bend portion in three layouts of a semiconductor layer, a gate wiring, and a wiring is rounded is described; however, the present invention is not limited thereto. In other words, it is acceptable as long as a corner portion or a bend portion in any one layer is rounded, so that a problem of dust, fine powder, or the like during a manufacturing step can be solved.

By forming a semiconductor device using a layout such as that above, a high performance and low power consumption semiconductor device can be provided with a lighter weight and at a lower price.

Note that this embodiment can be applied in free combination with Embodiment Mode 1, Embodiment Mode 2, and Embodiments 1 to 3.

Embodiment 5

In this embodiment, as one element that makes up a semiconductor device according to the present invention, an example of forming a static RAM (SRAM) is described with reference to FIGS. 9A to 11B.

Figure 9A:
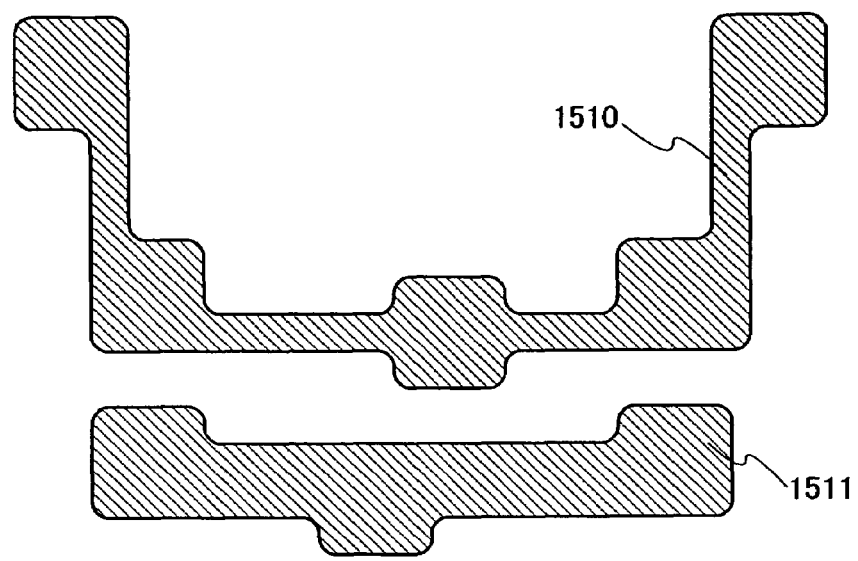
FIGS. 9A and 9B each show a layout of a semiconductor device according to the present invention (semiconductor layer)

Semiconductor layers 1510 and 1511 shown in FIG. 9A is preferably formed with silicon or a crystalline semiconductor including silicon. For example, polycrystalline silicon of which a silicon film is crystallized by laser annealing or the like, monocrystalline silicon, or the like is applied. In addition, a metal oxide semiconductor, amorphous silicon, or an organic semiconductor showing a semiconductor characteristic can be applied.

At any event, a semiconductor layer formed first is formed over an entire surface or a part of a surface (a region having a larger area than a region that is confirmed as a semiconductor region of a transistor) of a substrate having an insulating surface. Then, a mask pattern is formed over the semiconductor layer by photolithography. By etching the semiconductor layer using the mask pattern, the island-shaped semiconductor layers 1510 and 1511 that are of a prescribed shape, including a source region, a drain region and a channel forming region of a TFT are formed. The semiconductor layers 1510 and 1511 are determined taking into consideration the appropriateness of a layout.

Figure 9B:
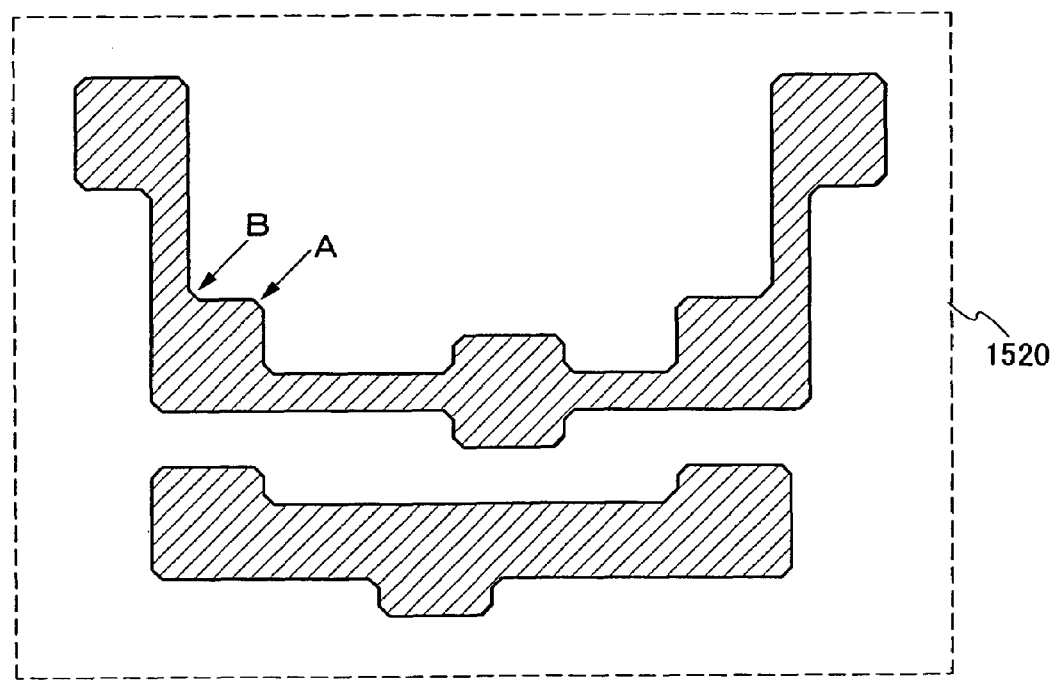

For a photomask for forming the semiconductor layers 1510 and 1511 shown in FIG. 9A, a mask pattern 1520 shown in FIG. 9B is provided. This mask pattern 1520 differs depending on whether a resist used in a photolithography step is a positive type or a negative type. In a case of using a positive type resist, the mask pattern 1520 shown in FIG. 9B is manufactured as a light shielding portion. The mask pattern 1520 has a shape of which a polygonal top portion A is removed. Also, a bend portion B has a plurality of bends so that a corner portion thereof is not a right angle. In this photomask pattern, for example, a corner portion of the pattern (right triangle) is removed to have a length of 10 μm or less on a side.

The shape of the mask pattern 1520 shown in FIG. 9B is reflected in the semiconductor layer 1510 and 1511 shown in FIG. 9A. In this case, a shape similar to the mask pattern 1520 may be transferred, or may be transferred such that the corner portion of the mask pattern 1520 is more rounded. In other words, a rounded portion of which a pattern shape is smoother than the mask pattern 1520 may be provided.

Figure 10A:
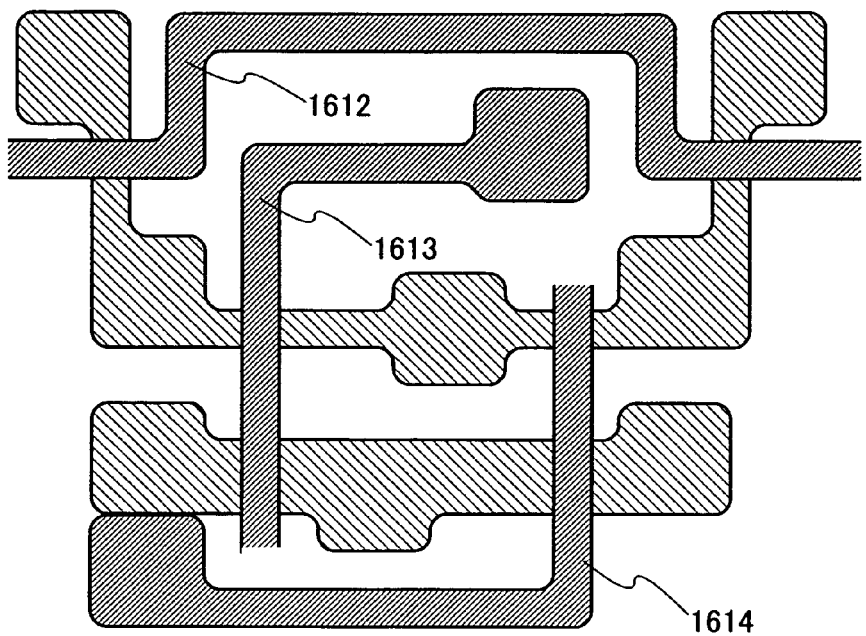
FIGS. 10A and 10B each show a layout of a semiconductor device according to the present invention (gate wiring)

Over the semiconductor layers 1510 and 1511, an insulating layer including silicon oxide or silicon nitride at least partially is formed. One purpose in forming this insulating layer is to form a gate insulating layer. Then, as shown in FIG. 10A, gate wirings 1612, 1613 and 1614 are formed so as to partially overlap with the semiconductor layers. The gate wiring 1612 is formed corresponding to the semiconductor layer 1510. The gate wiring 1613 is formed corresponding to the semiconductor layers 1510 and 1511. Also, the gate wiring 1614 is formed corresponding to the semiconductor layers 1510 and 1511. For the gate wirings, a metal layer or a semiconductor layer with high conductivity is formed, and then a shape thereof is formed over the insulating layer by photolithography.

Figure 10B:
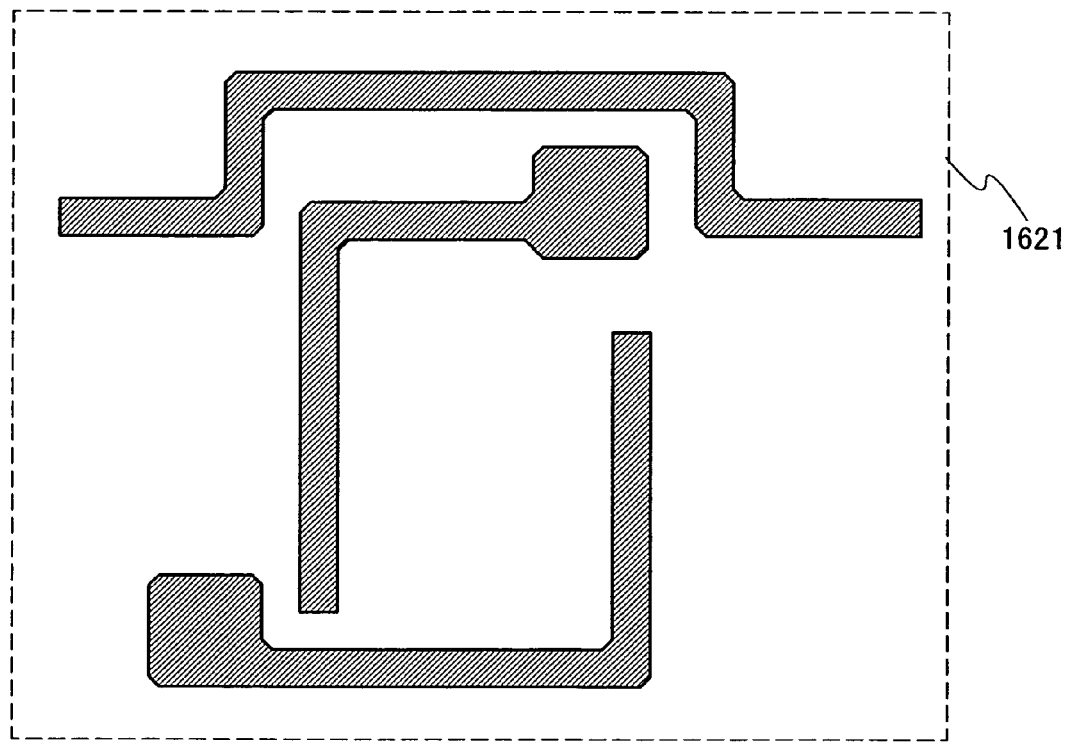

For a photomask for forming these gate wirings, a mask pattern 1621 shown in FIG. 10B is provided. This mask pattern 1621 has a corner portion that is a right triangle having a side with a length of 10 μm or less, or a length that is ⅕ to ½ of a wiring width, which is removed. The shape of the mask pattern 1621 shown in FIG. 10B is reflected in the gate wirings 1612, 1613, and 1614 shown in FIG. 10A. In this case, a shape similar to the mask pattern 1621 may be transferred, or may be transferred such that the corner portion of the mask pattern 1621 is more rounded. In other words, a rounded portion of which a pattern shape is smoother than the mask pattern 1621 may be provided. That is, a right triangle in a corner portion having a side with a length that is ⅕ to ½ of a wiring width is removed for each of the gate wirings 1612, 1613, and 1614, so that the corner portion is rounded. A projection can suppress generation of fine powder due to abnormal discharge during dry plasma etching, and at a depression the fine powder which tends to collect at the corner portion is washed away during washing, even if there is fine powder generated. As a result, there is an effect that yield can be improved.

An interlayer insulating layer is a layer formed after forming the gate wirings 1612, 1613, and 1614. The interlayer insulating layer is formed using an inorganic insulating material such as silicon oxide, or an organic material using polyimide or an acrylic resin. Between this interlayer insulating layer and the gate wirings 1612, 1613, and 1614, an insulating layer of silicon nitride, silicon nitride oxide or the like may be interposed. Also, an insulating layer of silicon nitride, silicon nitride oxide or the like may be provided over the interlayer insulating layer. This insulating layer can prevent contamination of the semiconductor layer or the gate insulating layer by an extrinsic impurity such as metal ions or moisture, which is not good for a TFT.

An opening is formed in a predetermined position in the interlayer insulating layer. For example, the opening is provided corresponding to the gate wirings or the semiconductor layer in the lower layer. For a wiring layer formed of a single layer or a plurality of layers of a metal or a metal compound, a mask pattern is formed by photolithography, and the wiring layer is etched into a predetermined pattern. Then, as show in FIG. 11A, wirings 1715 to 1720 are formed to partially overlap with the semiconductor layer. The wirings connect certain elements. The wirings do not connect the certain elements in a straight line, and there are bend portions due to a layout limitation. Also, a wiring width changes in a contact portion or in another region. In the contact portion, when a contact hole is about the same as or wider than the wiring width, the wiring width changes by expanding.

Figure 11A:
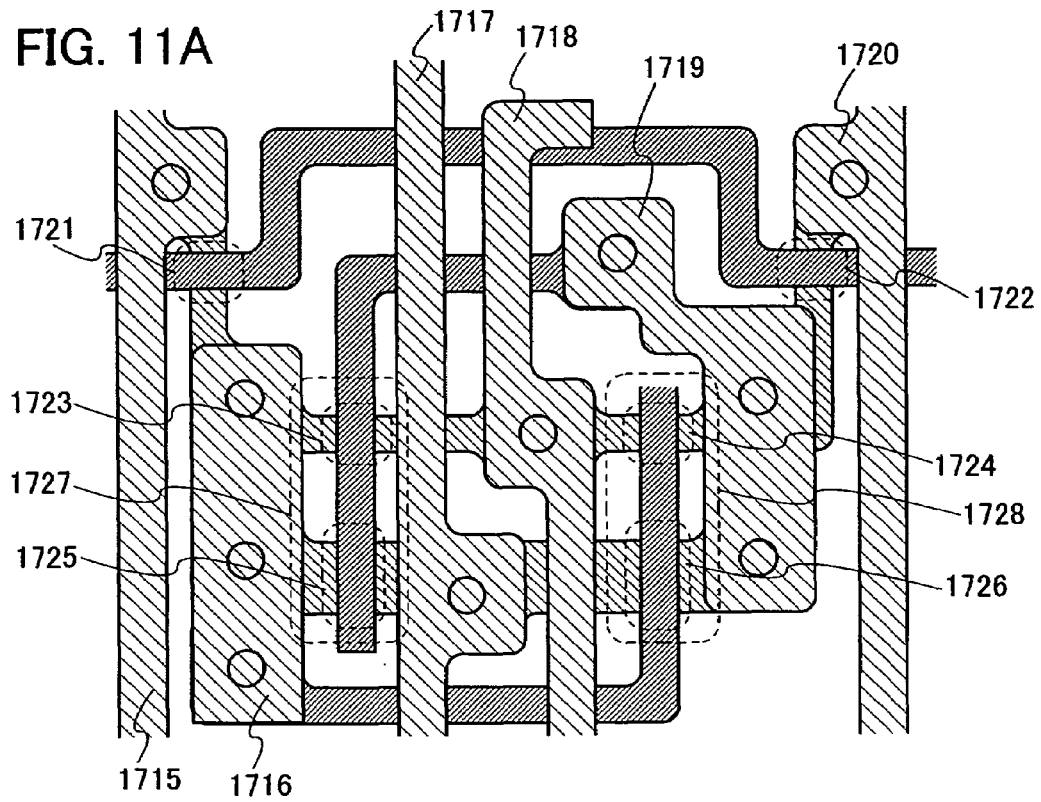
FIGS. 11A and 11B each show a layout of a semiconductor device according to the present invention (wiring)
Figure 11B:
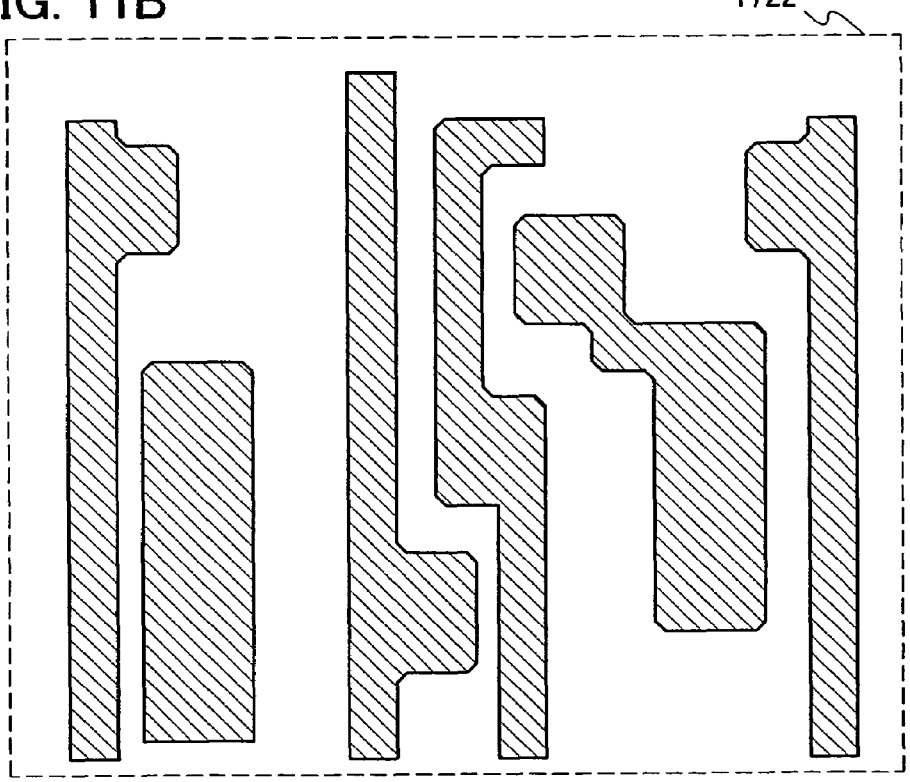

For a photo mask for forming the wirings 1715 to 1720, a mask pattern 1722 shown in FIG. 11B is provided. In this case also, each of the wirings has a pattern in which a right triangle formed in a corner portion thereof having a side with a length of 10 μm or less, or a length that is ⅕ to ½ of a wiring width is removed, and the corner portion is rounded. For such wirings, a projection can suppress generation of fine powder due to abnormal discharge during dry plasma etching, and at a depression the fine powder that tends to collect at the corner portion is washed away during washing, even if there is fine powder generated. As a result, there is an effect that yield can be improved. By the corner portions of the wirings being round, they can also be electrically conductive. Also, it is extremely favorable that dust can be washed away when a plurality of parallel wirings are provided.

In FIG. 11A, n-channel transistors 1721 to 1724 and p-channel transistors 1725 and 1726 are formed. The n-channel transistor 1723 and the p-channel transistor 1725 form an inverter 1727, and the n-channel transistor 1724 and the p-channel transistor 1726 form an inverter 1728. A circuit including these six transistors forms an SRAM. As an upper layer of these transistors, an insulating layer of silicon nitride, silicon oxide, or the like may be formed.

With such a structure as the foregoing, a high performance and low power consumption semiconductor device can be provided with a lighter weight and at a lower price.

Note that this embodiment can be applied in free combination with Embodiment Mode 1, Embodiment Mode 2, and Embodiments 1 to 4.

Embodiment 6

In this embodiment, a transistor forming a semiconductor device according to the present invention is described with reference to FIGS. 12 to 13E.

The transistor forming a semiconductor device according to the present invention may be a thin film transistor (TFT), in addition to a MOS transistor formed over a monocrystalline substrate. FIG. 12 shows a cross-sectional structure of these transistors forming circuits. FIG. 12 shows an n-channel transistor 1821, an n-channel transistor 1822, a capacitor 1824, a resistor 1825, and a p-channel transistor 1823. Each transistor is provided with a semiconductor layer 1805, a gate insulating layer 1808, and a gate electrode 1809. The gate electrode 1809 is formed as a stacked layer structure of a first conductive layer 1803 and a second conductive layer 1802. Also, FIGS. 13A, 13B, 13C, 13D, and 13E are top views corresponding to the n-channel transistor 1821, the n-channel transistor 1822, the capacitor 1824, the resistor 1825, and the p-channel transistor 1823 in FIG. 12, which can also be referred to.

Figure 12:
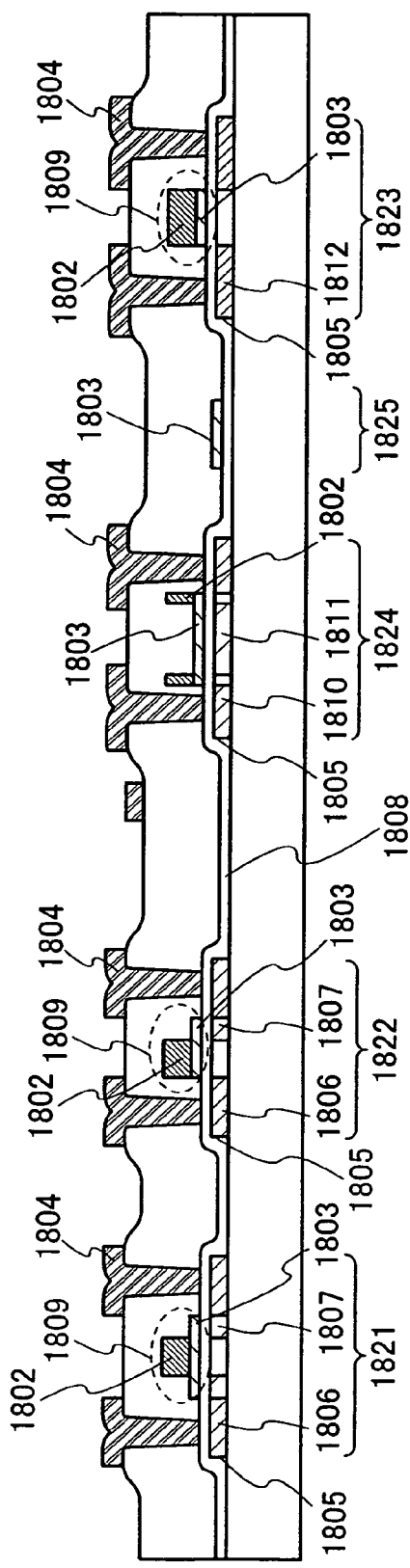
FIG. 12 shows a cross-sectional view of a semiconductor device according to the present invention.

In FIG. 12, in the n-channel transistor 1821, in a channel length direction (a direction in which carriers flow), an impurity region 1807 doped with an impurity at a lower concentration than the impurity concentration of an impurity region 1806 which forms a source region or drain region forming contact with a wiring 1804, which is also called a lightly doped drain (LDD), is formed in the semiconductor layer 1805. Into the impurity region 1806 and the impurity region 1807, phosphorus or the like is added as the impurity to impart n-type conductivity in the case of forming the n-channel transistor 1821. LDDs are formed as means to suppress hot-electron deterioration and short-channel effect.

Figure 13A:
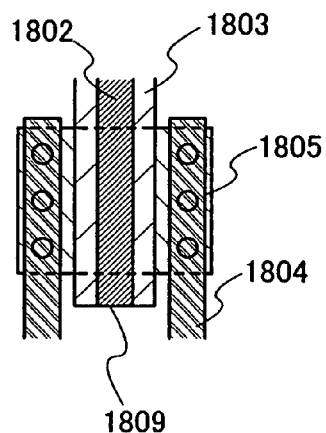
FIGS. 13A to 13E each show an electrical element forming a semiconductor device according to the present invention.

As shown in FIG. 13A, in the gate electrode 1809 of the n-channel transistor 1821, the first conductive layer 1803 is formed spreading on both sides of the second conductive layer 1802. In this case, the thickness of the first conductive layer 1803 is smaller than that of the second conductive layer. The first conductive layer 1803 is formed with a thickness through which ion species accelerated in an electric field of 10 kV to 100 kV can pass. The impurity region 1807 is formed so as to overlap with the first conductive layer 1803 of the gate electrode 1809. That is, an LDD region to be overlapped by the gate electrode 1809 is formed. In this structure, a one-conductive type impurity is added through the first conductive layer 1803 using the second conductive layer 1802 as a mask, thereby forming the impurity region 1807 in a self-aligned manner Accordingly, an LDD to overlap with the gate electrode is formed in a self-aligned manner.

The thin film transistor having an LDD on both sides is applied to a rectifying TFT of a power supply circuit in the embodiment mode or a transistor for forming a transmission gate (also called an "analog switch") used in a logic circuit. Since both positive and negative voltages are applied to the source region or drain region of such a TFT, an LDD is preferably provided on both sides of the gate electrode.

In addition, in a case where a gate wiring is formed using the second conductive layer 1802, the first conductive layer 1803 may be patterned so as to align both ends of the two layers. As a result, a minute gate wiring can be formed. In addition, it is not necessary to form an LDD to overlap with the gate electrode in a self-aligned manner.

Figure 13B:
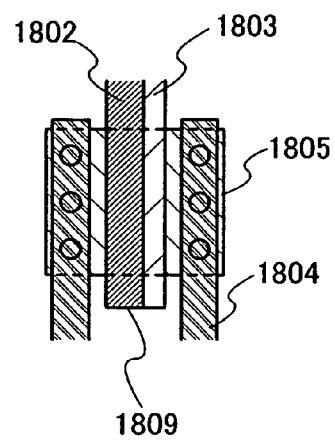

In FIG. 12, in the n-channel transistor 1822, the impurity region 1807 doped with an impurity at a lower concentration than the impurity concentration of the impurity region 1806 is formed on one side of the gate electrode in the semiconductor layer 1805. As shown in FIG. 13B, in the gate electrode 1809 of the n-channel transistor 1822, the first conductive layer 1803 is formed spreading on one side of the second conductive layer 1802. In this case also, a one-conductive type impurity is added through the first conductive layer 1803 using the second conductive layer 1802 as a mask, thereby the LDD can be formed in a self-aligned manner.

The transistor having an LDD on one side may be applied to a transistor in which only one of positive voltage and negative voltage is applied between a source region and a drain region. Specifically, it may be applied to a transistor for forming a logic gate such as an inverter circuit, a NAND circuit, a NOR circuit, or a latch circuit, or a transistor for forming an analog circuit such as a sense amplifier, a constant voltage generating circuit, or a VCO.

Figure 13C:
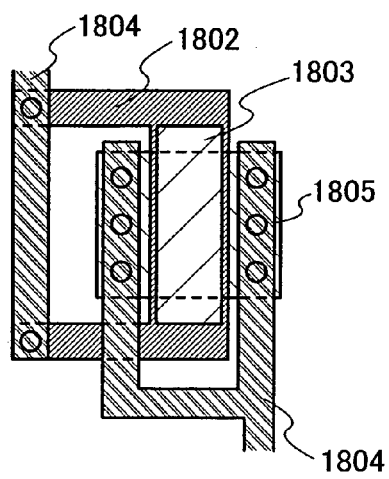

In FIG. 12, the capacitor 1824 is formed in which the gate insulating layer 1808 is interposed between the first conductive layer 1803 and the semiconductor layer 1805. In the semiconductor layer 1805 for forming the capacitor 1824, an impurity region 1810 and an impurity region 1811 are provided. The impurity region 1811 is formed in a position to overlap with the first conductive layer 1803 in the semiconductor layer 1805. In addition, the impurity region 1810 makes contact with the wiring 1804. The impurity region 1811 can be added with a one-conductivity type impurity through the first conductive layer 1803; therefore, the impurity concentrations of the impurity region 1810 and the impurity region 1811 can be made to be the same or different. At any event, the semiconductor layer 1805 which functions as an electrode in the capacitor 1824 is preferably reduced in resistance by adding the one-conductivity type impurity. In addition, the first conductive layer 1803 can be made to function sufficiently as an electrode by using the second conductive layer 1802 as an auxiliary electrode as shown in FIG. 13C. With such a composite electrode structure in which the first conductive layer 1803 and the second conductive layer 1802 are combined, the capacitor 1824 can be formed in a self-aligned manner.

The capacitor is used as a storage capacitor provided in a power supply circuit or as a resonant capacitor provided in a resonance circuit in the embodiment mode. In particular, the resonant capacitor in which both positive voltage and negative voltage are applied between two terminals of the capacitor is necessary to function as a capacitor regardless of whether the voltage between the two terminals is positive or negative.

Figure 13D:
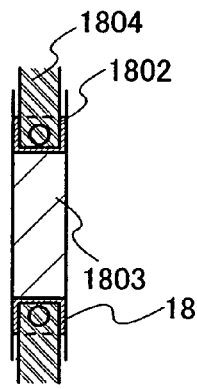

In FIG. 13D, the resistor 1825 is formed from the first conductive layer 1803. Since the first conductive layer 1803 is formed to have a thickness of about 30 nm to 150 nm, the resistor can be formed by setting the width and length as appropriate.

The resistor is used as a resistance load provided in a modulation/demodulation circuit in the embodiment mode. In addition, the resistor may be used as a load in the case of controlling a current using a VCO or the like. The resistor may be formed using a semiconductor layer including an impurity element at high concentration, or a thin metal layer. Compared with the semiconductor layer in which the resistance value depends on film thickness, film quality, impurity concentration, activation rate, and the like; the metal layer in which the resistance value is determined by film thickness and film quality is favorable because variation is small.

Figure 13E:
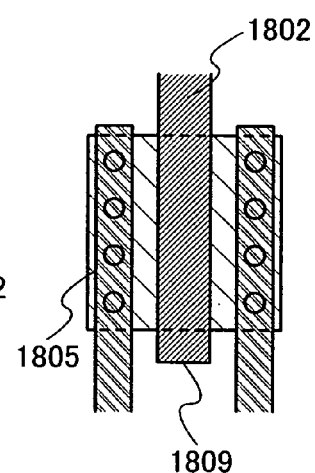

In FIG. 13E, the p-channel transistor 1823 has an impurity region 1812 in the semiconductor layer 1805. This impurity region 1812 forms a source region or drain region making contact with the wiring 1804. In a structure of the gate electrode 1809, the first conductive layer 1803 overlaps with the second conductive layer 1802. The p-channel transistor 1823 has a single drain structure in which an LDD is not provided. When the p-channel transistor 1823 is formed, boron or the like is added as an impurity imparting p-type conductivity into the impurity region 1812. On the other hand, if phosphorus is added into the impurity region 1812, an n-channel transistor of a single drain structure can be formed as well.

One or both of the semiconductor layer 1805 and the gate insulating layer 1808 may be oxidized or nitrided by high-density plasma treatment in which plasma is excited by a microwave, the electron temperature is 2 eV or less, the ion energy is 5 eV or less, and the electron density is about $10^{11}$ to $10^{13}/cm^3$. At this time, the treatment may be carried out by setting the substrate temperature at 300° C. to 450° C. and in an oxidizing atmosphere (such as $O_2$ or $N_2O$) or a nitriding atmosphere (such as $N_2$ or $NH_3$), thereby the defect level of an interface between the semiconductor layer 1805 and the gate insulating layer 1808 can be reduced. By carrying out this treatment on the gate insulating layer 1808, densification of this insulating layer can be achieved. That is, generation of an electric charge defect is suppressed and change of the threshold voltage of the transistor can be suppressed. In addition, in the case where the transistor is operated at a voltage of 3 V or less, this insulating layer oxidized or nitrided with the plasma treatment can be applied as the gate insulating layer 1808. In addition, in the case where the driving voltage of the transistor is 3 V or more, the gate insulating layer 1808 can be formed by combining the insulating layer formed over a surface of the semiconductor layer 1805 by plasma treatment and an insulating layer deposited by a CVD method (plasma CVD or thermal CVD). In addition, this insulating layer can also be used as a dielectric layer of the capacitor 1824. In this case, since the insulating layer formed with plasma treatment is a dense film formed with a thickness of 1 nm to 10 nm, a capacitor having large charge capacitance can be formed.

As described with reference to FIGS. 12 and 13A to 13E, by combining conductive layers having different thicknesses, elements having various structures can be formed. A region where only the first conductive layer is formed and a region where the first conductive layer and the second conductive layer are stacked can be formed using a photomask or a reticle which is provided with a diffraction grating pattern or an auxiliary pattern having a function of reducing optical intensity, which is formed of a semitransparent film. That is, in a photolithography process, the quantity of light transmitted through the photomask is adjusted when exposing the photoresist so that the thickness of a resist mask to be developed is varied. In this case, a slit at the resolution limit or less may be provided in the photomask or the reticle to form the foregoing resist having the complex shape. In addition, by baking at about 200° C. after developing, a mask pattern made from a photoresist material may be changed in shape.

In addition, by using the photomask or the reticle which is provided with a diffraction grating pattern or an auxiliary pattern having a function of reducing optical intensity, which is formed of a semitransparent film, the region where only the first conductive layer is formed and the region where the first conductive layer and the second conductive layer are stacked can be formed successively. As shown in FIG. 13A, the region where only the first conductive layer is formed can be formed selectively over the semiconductor layer. Such a region is effective over the semiconductor layer, but is not necessary in another region (a wiring region which is successive to the gate electrode). By using this photomask or reticle, the region where only the first conductive layer is formed is not necessary to be formed in the wiring region; thus, wiring density can be improved substantially.

In the case of FIG. 12 and FIGS. 13A to 13E, the first conductive layer is formed of a high melting point metal such as tungsten (W), chromium (Cr), tantalum (Ta), tantalum nitride (TaN) or molybdenum (Mo), or an alloy or a compound containing the high melting point metal as its main component with a thickness of 30 nm to 50 nm. In addition, the second conductive layer is formed of a high melting point metal such as tungsten (W), chromium (Cr), tantalum (Ta), tantalum nitride (TaN) or molybdenum (Mo), or an alloy or a compound containing the high melting point metal as its main component with a thickness of 300 nm to 600 nm. For example, different conductive materials are used for the first conductive layer and the second conductive layer so that a difference arises between them in the etching rate in a later etching process. As an example, a TaN film can be used for the first conductive layer and a tungsten film can be used for the second conductive layer.

According to the description of this embodiment, transistors having different electrode structures, a capacitor, and a resistor can be formed separately using the same patterning process by using the photomask or the reticle which is provided with a diffraction grating pattern or an auxiliary pattern having a function of reducing optical intensity, which is formed of a semitransparent film. Accordingly, in accordance with circuit characteristics, elements having different modes can be formed without increasing the number of steps and can be integrated.

By a semiconductor device including such a transistor as the foregoing, a high performance and low power consumption wireless chip can be provided with a lighter weight and at a lower price This embodiment can be applied in free combination with Embodiment Mode 1, Embodiment Mode 2, and Embodiments 1 to 5.

Embodiment 7

In this embodiment, an example of a system using a semiconductor device according to the present invention is described with reference to FIGS. 14 and 15. This embodiment will describe a user authentication system of a personal computer with high security, using a wireless chip as the semiconductor device of the present invention.

Figure 14:
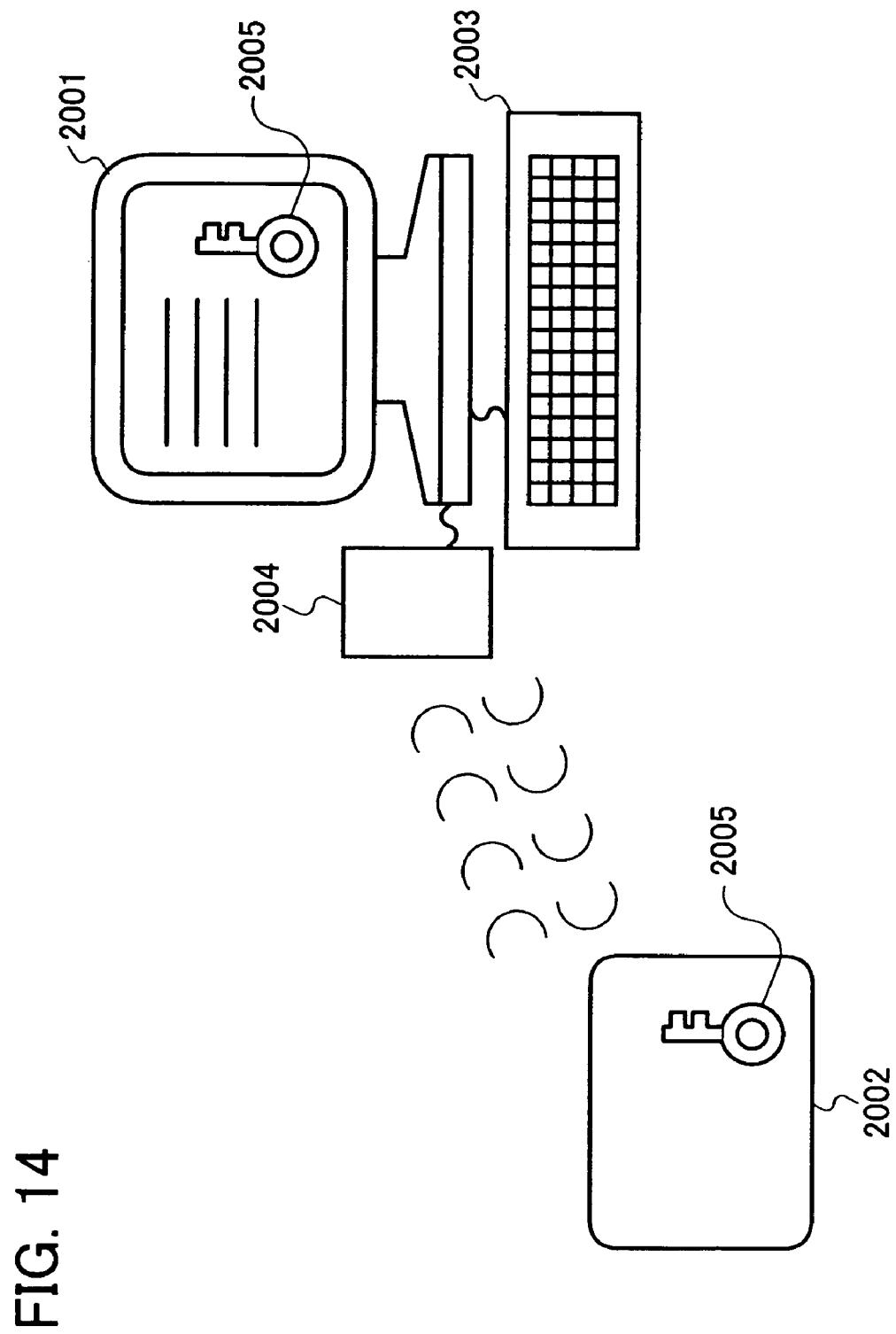
FIG. 14 is a schematic view of a user authentication system using a semiconductor device according to the present invention.
Figure 15:
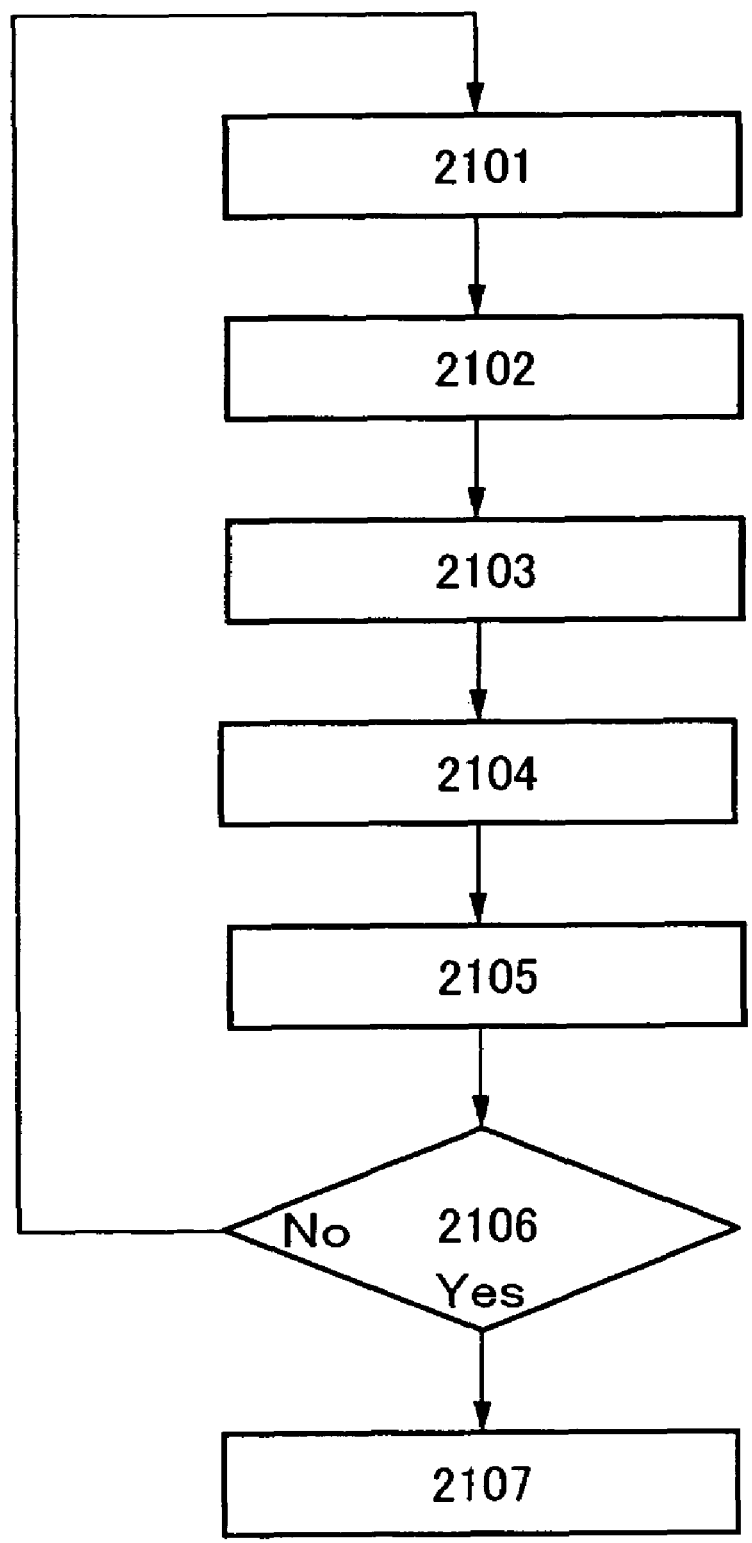
FIG. 15 is a flow chart of a user authentication system using a semiconductor device according to the present invention.

FIG. 14 is a schematic diagram of the user authentication system of this embodiment, which includes a personal computer 2001 and a wireless chip 2002. An input device 2003 and a reader/writer 2004 are connected to the personal computer 2001.

Both the personal computer 2001 and the wireless chip 2002 have a common key 2005 for encoding. Specifically, data of the common key 2005 is stored in respective memories of the personal computer 2001 and the wireless chip 2002. The common key 2005 is, for example, data of 64 to 128 bits, which is used for encoding a plain text (data before being encoded) and decoding an encoded text. As for the common key, different common keys are formed for each user who is officially registered and all of them are stored in the personal computer 2001. In other words, the personal computer 2001 has the number of common keys corresponding to the number of users registered officially. On the other hand, the wireless chip 2002 is owned by a user who registered officially, and has only the common key specific to the user. The common key must be kept without being known to another person.

Although the case where a common key encoding method (see ISO/IEC 9798-2 Information technology-Security techniques-Entity authentication-Part 2: Mechanisms using symmetric encipherment algorithms) is used as the encoding method is described in this embodiment, the invention can be applied to the case of another encoding method such as a public key encoding method (see ISO/IEC 9798-3 Information technology-Security techniques-Entity authentication-Part 3: Mechanisms using digital signature techniques).

The personal computer 2001 has a means for encoding a plain text by using the common key 2005. Specifically, software of carrying out encoding algorithm is provided. In addition, the wireless chip 2002 has a means for decoding an encoded text by using the common key 2005. Specifically, decoding algorithm is carried out in the arithmetic circuit described in the foregoing embodiment mode.

Hereinafter, usage of the user authentication system of this embodiment is described with reference to a flow chart of FIG. 15.

First, a prospective user inputs a user name and a password to the personal computer 2001 with the input device 2003 (USER NAME INPUT 2101). The password is registered in advance by a user who is registered officially. The personal computer 2001 encodes a plain text by using a corresponding common key depending on the input user name (ENCODED DATA CREATION 2102). Here, a plain text may be either data having a specific meaning or data having no meaning. Next, the encoded data is transferred from the reader/writer 2004 (ENCODED DATA TRANSMISSION 2103). The wireless chip 2002 receives the encoded data, decodes it with the common key 2005 (DECODING PROCESS 2104), and transmits the decoded data to the reader/writer (DECODED DATA TRANSMISSION 2105). The personal computer 2001 compares the decoded data with the original plain text (AUTHENTICATION 2106), and only in the case where they match with each other, verifies the prospective user as the user registered officially and permits use (NORMAL USE 2107).

In such a user authentication system of this embodiment as described above, a computer can only be used by someone who knows a password thereof and has a wireless chip of the invention. Therefore, security is extremely higher than authentication only with a password. In addition, a user can utilize a personal computer in the same way as that with the conventional authentication of only a password, if the wireless chip is taken along by the user, and there is little additional burden.

Note that the user authentication of a personal computer has been described in this embodiment; however, this embodiment can be easily applied to another system capable of being utilized only by a user who is registered officially. For example, it can be easily applied to an ATM (Automated Teller Machine), a CD (Cash Dispenser), or the like.

By having such a structure as the foregoing, an extremely secure user authentication system using a semiconductor device of the present invention can be established at low cost.

Note that this embodiment can be applied in free combination with Embodiment Mode 1, Embodiment Mode 2, and Embodiments 1 to 6.

Embodiment 8

In this embodiment, an antenna that is mounted to a semiconductor device according to the present invention is described with reference to FIGS. 18A to 18D. It is acceptable as long as the antenna has a size and a shape within a range set by the Radio Law, that are appropriate for a purpose. The frequency of a signal transmitted and received is 125 kHz, 13.56 MHz, 915 MHz, 2.45 GHz or the like, each of which is standardized by ISO or the like. Specifically, a dipole antenna, a patch antenna, a loop antenna, a Yagi antenna, and the like may be used. The shape of an antenna connected to a wireless chip will be described hereinafter.

Figure 18A:
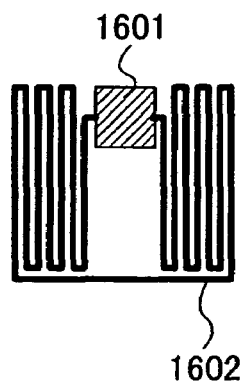
FIGS. 18A to 18D each show a layout of an antenna mounted to a semiconductor device according to the present invention.

FIG. 18A shows a wireless chip 1601 to which an external antenna 1602 is connected. In FIG. 18A, the wireless chip 1601 is provided at the center portion, and the antenna 1602 is connected to a connection terminal of the wireless chip 1601. The antenna 1602 is bent and has a rectangular shape so as to ensure the length of the antenna.

Figure 18B:
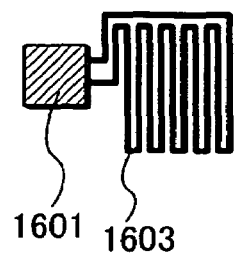

FIG. 18B shows a mode in which an external antenna 1603 is provided on a connection terminal at one side end of the wireless chip 1601. The antenna 1603 is bent and has a rectangular shape so as to ensure the length of the antenna.

Figure 18C:
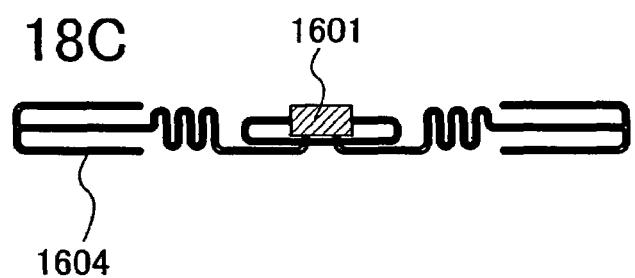

FIG. 18C shows a mode in which an external antenna 1604 that is bent and has a rectangular shape is provided on opposite ends of the wireless chip 1601.

Figure 18D:
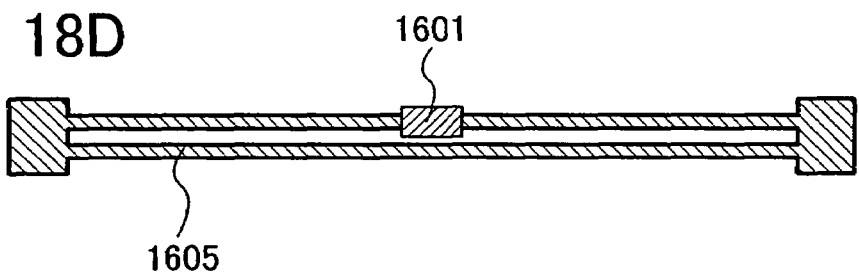

FIG. 18D shows a mode in which a linear external antenna 1605 is provided on opposite ends of the wireless chip 1601.

A shape of an antenna may be selected in accordance with a structure or a polarized wave of a wireless chip, or use of the wireless chip. Specifically, if a dipole antenna is used as the antenna, it may be a folded dipole antenna. If a loop antenna is used as the antenna, it may be a circular loop antenna or a square loop antenna. If a patch antenna is used as the antenna, it may be a circular patch antenna or a square patch antenna.

If a patch antenna is used, the antenna may use a dielectric material such as ceramic. The antenna can be reduced in size by increasing the dielectric constant of a dielectric material used for a substrate of the patch antenna. In addition, the patch antenna has high mechanical strength and thus can be used repeatedly.

A dielectric material of a patch antenna may be formed of ceramic, an organic resin, a mixture of ceramic and an organic resin, or the like. Ceramic is typified by alumina, glass, forsterite, and the like. Further, plural kinds of ceramics may be mixed to be used. In order to obtain a high dielectric constant, a dielectric layer is preferably formed of a ferroelectric material. The ferroelectric material is typified by barium titanate ($BaTiO_3$), lead titanate ($PbTiO_3$), strontium titanate ($SrTiO_3$), lead zirconate ($PbZrO_3$), lithium niobate ($LiNbO_3$), lead zirconate titanate (PZT), and the like. Further, plural kinds of ferroelectric materials may be mixed to be used.

Structures shown in the embodiment mode and the above embodiments can be applied to the wireless chip 1601.

With such a structure as the foregoing, a high performance semiconductor device can be provided.

Note that this embodiment can be applied in free combination with Embodiment Mode 1, Embodiment Mode 2, and Embodiments 1 to 7.

Embodiment 9

Figure 4A:
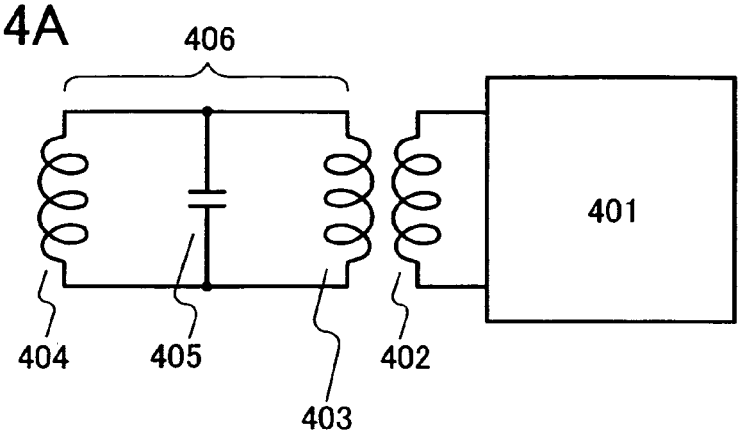
FIGS. 4A to 4C show a circuit diagram and layouts of an antenna mounted to a semiconductor device according to the present invention.
Figure 4B:
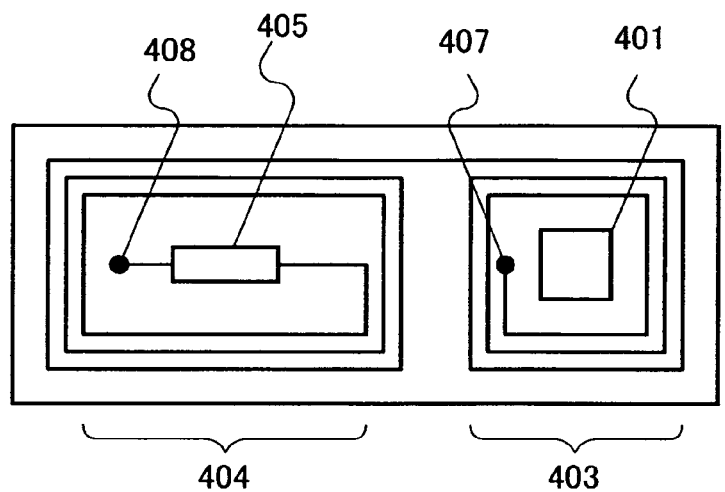
Figure 4C:
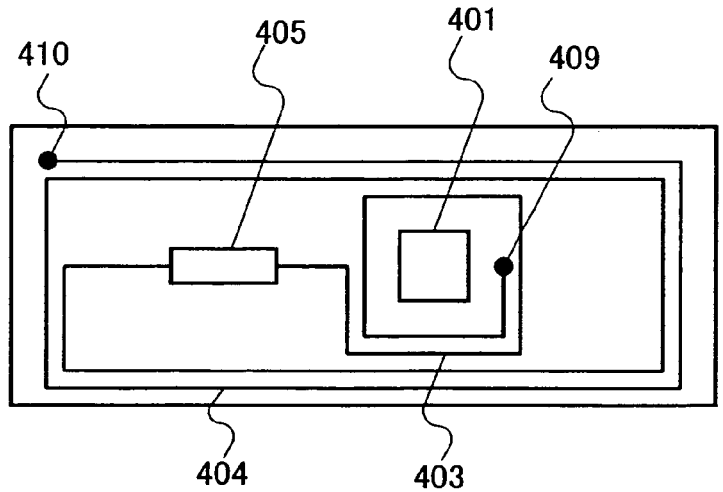

In this embodiment, a structure of an antenna mounted to a semiconductor device according to the present invention that is different from that of the example described in Embodiment 8 is described with reference to FIGS. 4A to 4C. FIGS. 4A to 4C are a circuit diagram and layouts of a semiconductor device including a wireless chip according to this embodiment, a first antenna, a second antenna, a third antenna, and an electrical capacitor.

FIG. 4A is a circuit diagram of a semiconductor device according to this embodiment. The semiconductor device shown in FIG. 4A includes a wireless chip 401, a first antenna (internal antenna) 402 mounted to the wireless chip 401, a second antenna 403, a third antenna 404, and an electrical capacitor 405. An external antenna 406 includes the second antenna 403, the third antenna 404, and the electrical capacitor 405.

When the third antenna 404 receives a communication signal from a reader/writer, induced electromotive force is generated by electromagnetic induction in the third antenna 404. By this induced electromotive force, an induction field occurs from the second antenna 403. By this induction field being received by the first antenna 402, induced electromotive force is generated by electromagnetic induction in the first antenna 402.

Here, by increasing the inductance of the third antenna 404, the induction field received by the first antenna 402 can be increased. In other words, even if the inductance of the first antenna 402 is small, sufficient induction field for operating the wireless chip 401 can be supplied. When the first antenna 402 is an on-chip antenna, since the wireless chip 401 has a small area, inductance cannot be made to be too large. Consequently, when only the fist antenna 402 is used, it is difficult to extend a communication distance of the wireless chip 401. However, with the structure described in this embodiment, the communication distance can be extended even for a wireless chip with an on-chip antenna.

FIG. 4B is a first example of an antenna layout of the semiconductor device according to this embodiment. FIG. 4B is an example of forming the second antenna 403 outside of the third antenna 404. A first through-hole 407 and a second through-hole 408 are electrically connected, and the external antenna is formed by the second antenna 403, the third antenna 404, and the electrical capacitor 405. For the electrical capacitor 405, a chip capacitor, a film capacitor or the like can be used. In a layout such as that of FIG. 4B, an antenna with a narrow width can be formed; therefore, it is effective when providing a semiconductor device with a narrow-width shape.

FIG. 4C is a second example of the antenna layout of the semiconductor device according to this embodiment. FIG. 4C is an example of forming the second antenna 403 inside of the third antenna 404. A first through-hole 409 and a second through-hole 410 are electrically connected, and the external antenna is formed by the second antenna 403, the third antenna 404, and the electrical capacitor 405. For the electrical capacitor 405, a chip capacitor, a film capacitor, or the like can be used. In a layout such as that of FIG. 4C, an antenna with a narrow width can be formed; therefore, it is effective when providing a semiconductor device with a narrow-width shape.

With such a structure as the above, a high performance semiconductor device with an extended communication distance can be provided.

Note that this embodiment can be applied in free combination with Embodiment 1, Embodiment 2, and Embodiments 1 to 8.

Embodiment 10

In this embodiment, an example of a semiconductor device according to the present invention having a three-dimensional multilayer stacked structure is described with reference to FIG. 19.

Figure 19:
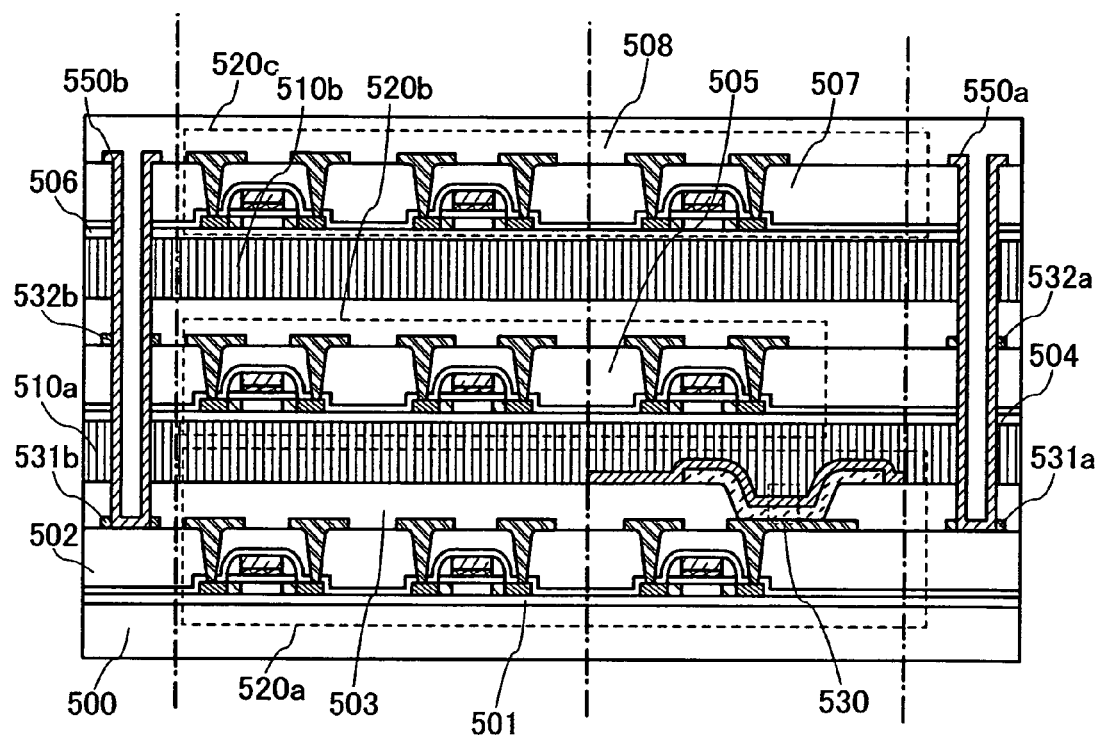
FIG. 19 shows a structural example of a semiconductor device according to the present invention.

In FIG. 19, an integrated circuit 520a, an integrated circuit 520b, and an integrated circuit 520c each manufactured over different substrates and then peeled therefrom are stuck together by an insulating layer 510a and an insulating layer 510b. For the stacked integrated circuits, the nonvolatile storage device according to the present invention described in the embodiment mode and the embodiments, an in this embodiment, a nonvolatile storage device is used for the integrated circuit 520a. The semiconductor device of a multilayer structure in FIG. 19 includes insulating layers 501, 502, 503, 504, 505, 506, 507, and 508; wiring layers 531a, 531b, 532a, and 532b; and a memory element 530. The semiconductor device of a multilayer structure is formed by sticking together the integrated circuit 520a including a transistor that is over a substrate 500 and the integrated circuit 520b including a transistor that is over the insulating layer 504, with the insulating layer 510a; and in a similar manner sticking together the integrated circuit 520b and the integrated circuit 520c including a transistor that is over the insulating layer 506, with the insulating layer 510b.

A process of sticking is described. An insulating material that is liquid (having fluidity) is applied over the integrated circuit 520a by a spin coating method or a droplet discharging method, and the integrated circuit 520b peeled from a substrate in a peeling step is stuck before fluidity is lost. Subsequently, the insulating material is dried to so that it is solidified, and the insulating layer 510a is formed. Consequently, the integrated circuit 520a and the integrated circuit 520b are fixed to each other with the insulating layer 510a as an adhesion layer. In a similar manner, an insulating material having fluidity is applied over the integrated circuit 520b, and the integrated circuit 520c peeled from a substrate in a peeling step is stuck before fluidity is lost. After drying, a stacked layer of the integrated circuit 520a, the insulating layer 510a, the integrated circuit 520b, the insulating layer 510b, and the integrated circuit 520c is formed. For the insulating layer 510a and the insulating layer 510b, polyimide, acrylic, polyamide, polyimide amide, a resist, benzocyclobutene, siloxane, or the like can be used. In this embodiment, a siloxane resin is used. When the insulating layer 510a and the insulating layer 510b are formed of an insulating material having fluidity, it is preferable that viscosity is relatively high and that adhesion between the integrated circuits is high. As in this embodiment, by using an insulating layer as an adhesion layer between integrated circuits, it is not necessary to separately form an adhesion layer for sticking and therefore the process can be simplified.

Next, an opening is formed in the insulating layers that form the stacked-layer structure, and the integrated circuit 520a, the integrated circuit 520b, and the integrated circuit 520c are electrically connected. The wiring layer 550a and the wiring layer 550b are formed in contact with the wiring layer 532a and the wiring layer 532b provided over the insulting layer 505; and the wiring layer 531a and the wiring layer 531b provided over the insulating layer 502, respectively. The wiring layer 550a is formed in an opening which is formed in the insulating layers 503, 504, 505, 506, and 507, and which exposes the wiring layer 531a and the wiring layer 532a. In a similar manner, the wiring layer 550b is formed in an opening which is formed in the insulating layers 503, 504, 505, 506, and 507, and which exposes the wiring layer 531b and the wiring layer 532b. The wiring layer 550a is electrically connected to the wiring layer 531a and the wiring layer 532a, and the wiring layer 550b is electrically connected to the wiring layer 531b and the wiring layer 532b.

By the above process, a semiconductor device with a multilayer structure having a stacked-layer structure of integrated circuits stuck together with an insulating layer interposed therebetween, in which the integrated circuits are electrically connected to each other, can be manufactured.

This embodiment can be applied in free combination with Embodiment Mode 1, Embodiment Mode 2, and Embodiments 1 to 9.

Embodiment 11

In this embodiment, an example of forming a mask ROM as an example of a nonvolatile storage device according to the present invention is described.

The mask ROM is formed of a plurality of transistors and an electronic element, and the transistors and the electronic element are formed by a photolithography method. At that time, it is possible for example to write data by opening or not opening a contact hole for a wiring that connects to one terminal (for example the electrical element 109 in FIG. 2) of the electronic element; for example, data (information) of 1 (on) when it is opened, and 0 (off) when it is not opened can be written in a memory cell.

In a step of light-exposing a photoresist, before or after a step of exposure thorough a reticle (photomask) using a light-exposure apparatus such as a stepper, photoresist over a region where the contact hole is opened is irradiated with an electron beam or a laser. Subsequently, steps of development, etching, peeling of the photoresist, and the like are carried out as usual. Consequently, a pattern of opening the contact hole and a pattern of not opening the contact hole can be separately formed just by selecting a region to be irradiated with an electron beam or a laser, without changing the reticle (photomask). In other words, by selecting the region irradiated with an electron beam or a laser, it is possible to manufacture a mask ROM for each semiconductor device so that data written to the mask ROMs are different from each other, during manufacturing of semiconductor devices.

By using such a mask ROM, it is possible to form a unique identifier (UID) for each semiconductor device during manufacturing of semiconductor devices. Further, since the semiconductor device according to this embodiment also includes a memory that is additionally writable, data can be written after manufacturing the semiconductor device.

This embodiment can be applied in free combination with Embodiment Mode 1, Embodiment Mode 2, and Embodiments 1 to 10.

This application is based on Japanese Patent Application serial no. 2005-375564 filed in Japan Patent Office on Dec. 27in 2005, the entire contents of which are hereby incorporated by reference.

What is claimed is:

1. A semiconductor device comprising:
 a nonvolatile storage device comprising:
  a storage element comprising:
   an electrical resistor;

a reset element electrically connected to the electrical resistor; and a latch element electrically connected to the reset element and the electrical resistor, wherein information is stored in the latch element by the reset element, wherein the information is determined depending on whether the electrical resistor is electrically conductive or insulated, and wherein the electrical resistor is configured to be electrically insulated by cutting by laser drawing.

2. The semiconductor device according to claim 1, wherein the reset element or the latch element comprises a thin film transistor comprising a semiconductor thin film as an activation layer, and wherein the semiconductor thin film is formed over a substrate having an insulating surface.

3. The semiconductor device according to claim 2, wherein the substrate having the insulating surface is one selected from the group consisting of a glass substrate, a quartz substrate, a plastic substrate, and an SOI substrate.

4. A semiconductor device comprising:
a nonvolatile storage device comprising:
   a storage element comprising:
     a reset element;
     an electrical resistor; and
     a latch element, wherein a first terminal of the reset element is electrically connected to a first wiring, wherein a first terminal of the electrical resistor is electrically connected to a second wiring, wherein a second terminal of the reset element is electrically connected to a second terminal of the electrical resistor and a third wiring, wherein first and second terminals of the latch element are electrically connected to the third wiring, and wherein the electrical resistor is configured to be electrically insulated by cutting by laser drawing.

5. The semiconductor device according to claim 4, wherein the reset element or the latch element comprises a thin film transistor comprising a semiconductor thin film as an activation layer, and wherein the semiconductor thin film is formed over a substrate having an insulating surface.

6. The semiconductor device according to claim 5, wherein the substrate having the insulating surface is one selected from the group consisting of a glass substrate, a quartz substrate, a plastic substrate, and an SOI substrate.

7. A semiconductor device comprising:
a nonvolatile storage device comprising:
   a storage element comprising:
     a first diode;
     a second diode;
     a reset element; and
     a latch element, wherein a terminal of the reset element is electrically connected to a first wiring, wherein first and second terminals of the latch element are electrically connected to the first wiring, wherein the second diode is electrically connected to the first wiring through the first diode, and wherein at least one of the first diode and the second diode is configured to be electrically conductive by applying excess current.

8. The semiconductor device according to claim 7, wherein the reset element or the latch element comprises a thin film transistor comprising a semiconductor thin film as an activation layer, and wherein the semiconductor thin film is formed over a substrate having an insulating surface.

9. The semiconductor device according to claim 8, wherein the substrate having the insulating surface is one selected from the group consisting of a glass substrate, a quartz substrate, a plastic substrate, and an SOI substrate.

10. The semiconductor device according to claim 1, wherein the latch element comprises a first inverter and a second inverter.

11. The semiconductor device according to claim 4, wherein the latch element comprises a first inverter and a second inverter.

12. The semiconductor device according to claim 7, wherein the latch element comprises a first inverter and a second inverter.

13. A semiconductor device comprising:
a nonvolatile storage device comprising:
   a storage element comprising:
     a first diode;
     a second diode electrically connected to the first diode;
     a reset element electrically connected to the first diode and the second diode; and
     a latch element electrically connected to the reset element and the first diode and the second diode, wherein information is stored in the latch element by the reset element, and wherein the information is determined depending on whether at least one of the first diode and the second diode is electrically conductive or insulated wherein at least one of the first diode and the second diode is configured to be electrically conductive by applying excess current.

14. The semiconductor device according to claim 13, wherein the reset element or the latch element comprises a thin film transistor comprising a semiconductor thin film as an activation layer, and wherein the semiconductor thin film is formed over a substrate having an insulating surface.

15. The semiconductor device according to claim 14, wherein the substrate having the insulating surface is one selected from the group consisting of a glass substrate, a quartz substrate, a plastic substrate, and an SOI substrate.

16. The semiconductor device according to claim 13, wherein the latch element comprises a first inverter and a second inverter.

* * * * *